United States Patent
Narazaki

(10) Patent No.: US 6,495,863 B2
(45) Date of Patent: Dec. 17, 2002

(54) SEMICONDUCTOR DEVICE HAVING DIODE FOR INPUT PROTECTION CIRCUIT OF MOS STRUCTURE DEVICE

(75) Inventor: Atsushi Narazaki, Hyogo (JP)

(73) Assignees: Mitsubishi Denki Kabushiki Kaisha, Tokyo (JP); Ryoden Semiconductor System Engineering Corporation, Itami (JP)

( * ) Notice: Subject to any disclaimer, the term of this patent is extended or adjusted under 35 U.S.C. 154(b) by 0 days.

(21) Appl. No.: 09/883,201

(22) Filed: Jun. 19, 2001

(65) Prior Publication Data

US 2002/0050602 A1 May 2, 2002

(30) Foreign Application Priority Data

Oct. 31, 2000 (JP) ........................................ 2000-332292

(51) Int. Cl.[7] .............................................. H01L 29/74
(52) U.S. Cl. ...................... 257/106; 257/199; 257/481; 257/551; 257/603; 257/604; 257/606; 257/618; 257/622; 257/653
(58) Field of Search ................................ 257/106, 199, 257/481, 551, 603–606, 618, 622, 654, 653

(56) References Cited

U.S. PATENT DOCUMENTS

| | | | | | |
|---|---|---|---|---|---|
| 4,135,950 A | * | 1/1979 | Rittner | ........................ | 136/255 |
| 4,280,131 A | * | 7/1981 | Ono et al. | ................... | 257/653 |
| 4,524,376 A | * | 6/1985 | Cornick | ....................... | 257/170 |
| 5,262,668 A | * | 11/1993 | Tu et al. | ....................... | 257/475 |
| 5,502,338 A | * | 3/1996 | Suda et al. | .................. | 123/651 |
| 5,504,022 A | * | 4/1996 | Nakanishi et al. | . | 148/DIG. 138 |
| 5,736,779 A | * | 4/1998 | Kobayashi | .................... | 257/355 |
| 6,218,701 B1 | * | 4/2001 | Semple et al. | ............... | 257/286 |

FOREIGN PATENT DOCUMENTS

| | | | | |
|---|---|---|---|---|
| JP | 54006786 A | * | 1/1979 | ........... H01L/33/00 |
| JP | 7-321305 | | 12/1995 | |
| JP | 8-70123 | | 3/1996 | |
| JP | 8-288525 | | 11/1996 | |
| JP | 9-97901 | | 4/1997 | |
| JP | 2001085681 A | * | 3/2001 | ........... H01L/29/78 |

* cited by examiner

Primary Examiner—Allan R. Wilson
Assistant Examiner—Paul E Brock, II
(74) Attorney, Agent, or Firm—Oblon, Spivak, McClelland, Maier & Neustadt, P.C.

(57) ABSTRACT

An insulator film provided on a region for arranging a Zener diode has a plurality of groove portions successively arranged in a direction D1 of extension of each semiconductor region forming the diode. Each groove potion extends in a width direction D2 of each semiconductor region, and has a depth T3. Each semiconductor region is arranged on the upper surface of the insulator film. Therefore, it follows that each semiconductor region has a plurality of irregular shapes arranged in the direction D1 of extension and the Zener diode has a peripheral length not only in the transverse direction D1 but also in a vertical direction D3, so that a p-n junction area in the Zener diode is increased. Thus, parasitic resistance of an input protection Zener diode is reduced for improving a gate insulator film protective function of the diode.

8 Claims, 28 Drawing Sheets

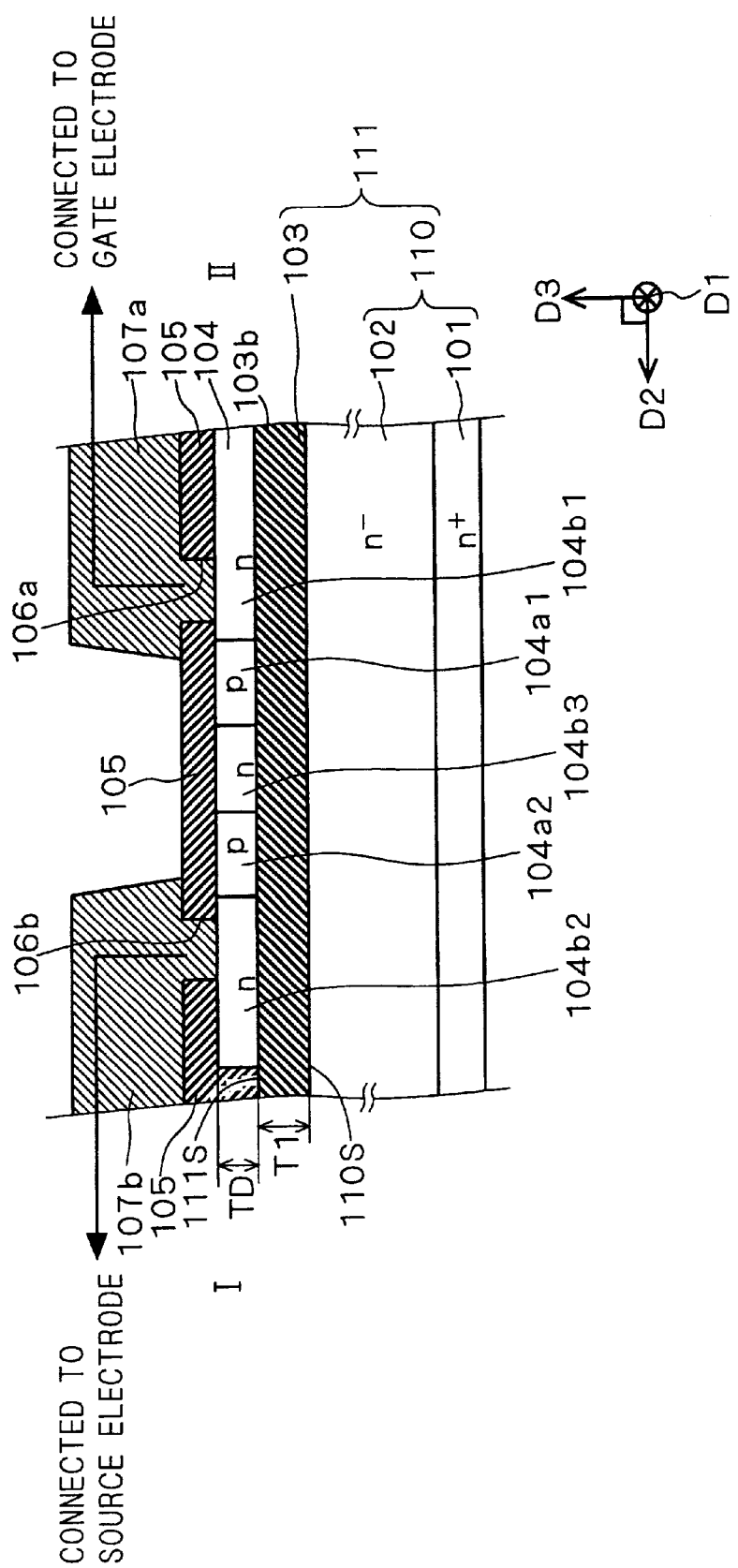

F/G. 3
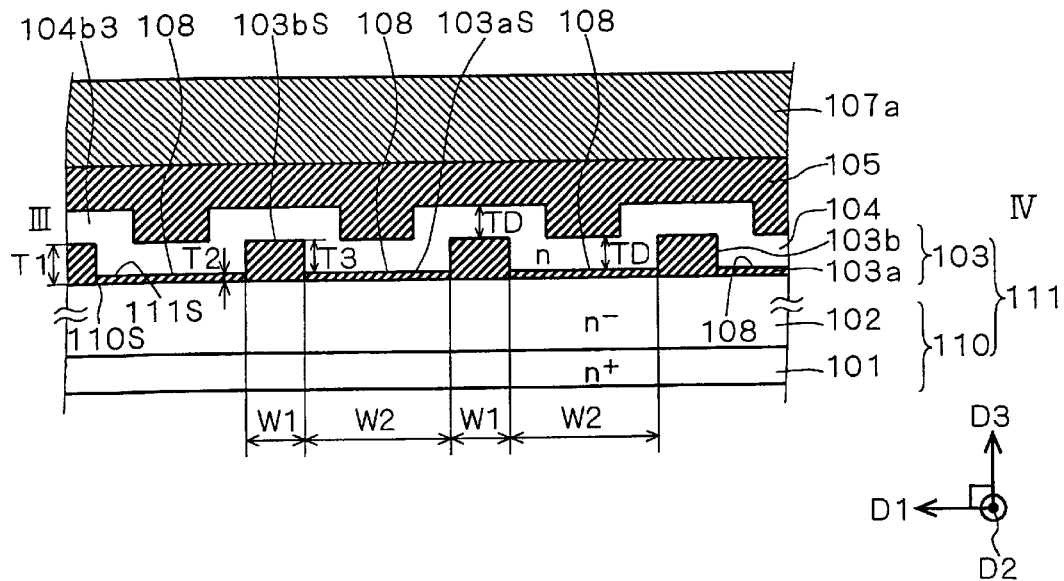
F/G. 4
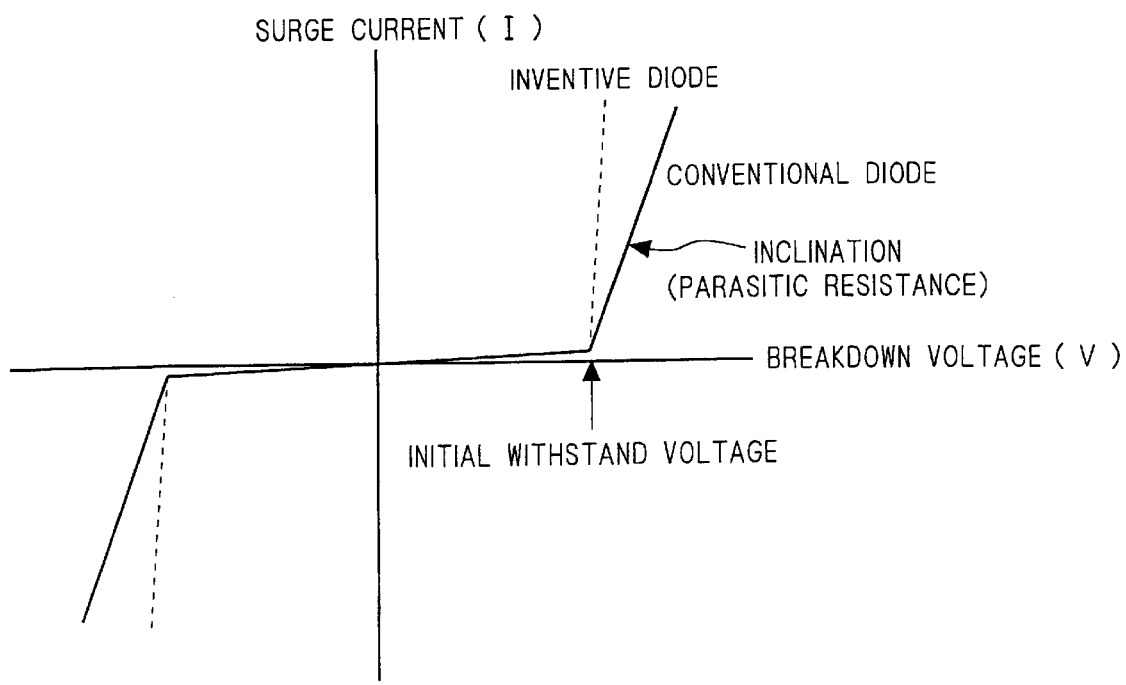

F I G. 13
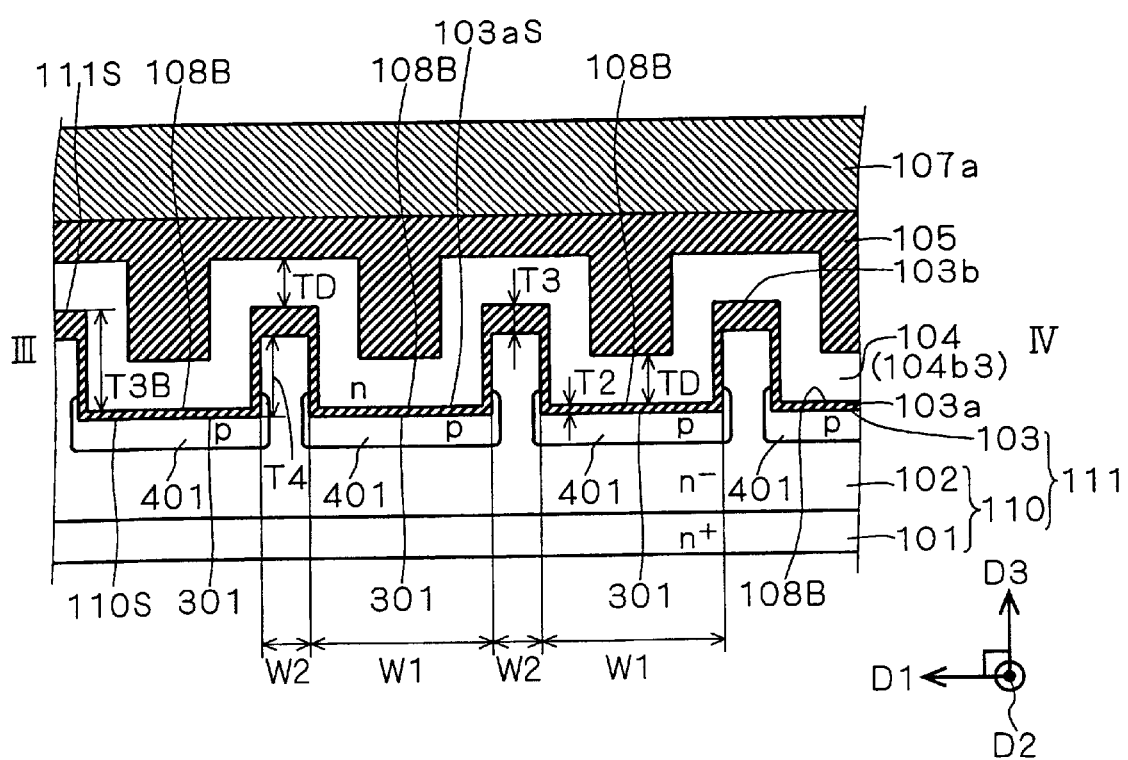

ZENER DIODE FOR
INPUT PROTECTION

GETE PAD

SEMICONDUCTOR DEVICE HAVING DIODE FOR INPUT PROTECTION CIRCUIT OF MOS STRUCTURE DEVICE

BACKGROUND OF THE INVENTION

1. Field of the Invention

The present invention relates to a semiconductor device and a method of manufacturing the same, and more particularly, it relates to a technique effective for forming an input protection circuit of a MOS structure device.

2. Description of the Background Art

A MOS structure semiconductor element having a gate oxide film represented by a power MOSFET (metal oxide semiconductor field-effect transistor) or an IGBT (insulated gate bipolar transistor) requires an input protection circuit for protecting the semiconductor element against a surge current or static electricity, as well known in the art. When a surge current or static electricity flows into a gate electrode of the MOS structure semiconductor element, remarkable deterioration is readily caused on the electrostatic characteristic of a gate insulator film of the MOS structure semiconductor element. In general, therefore, a bidirectional Zener diode is provided between a gate electrode and a source electrode of a power MOSFET as the aforementioned input protection circuit, as shown in an equivalent circuit of FIG. 39. Such a countermeasure is disclosed in the description of paragraph [0002] and FIG. 4 in Japanese Patent Application Laid-Open Gazette No. 7-321305 (1995), for example.

FIG. 40 is a top plan view showing the layout of a semiconductor device having a plurality of MOS structure semiconductor elements and an input protection circuit therefor, which is also employed in later description of an embodiment 1 of the present invention and modifications thereof.

FIG. 41 is a top plan view schematically showing an input protection Zener diode forming region hatched in FIG. 40 among regions formed on the upper surface of a base layer of the aforementioned semiconductor device in an enlarged manner. The input protection Zener diode forming region is hereinafter referred to as a first region, and a region formed with a MOS transistor structure having a gate electrode and a main electrode is referred to as a second region. The definition of these regions also applies to later description of the embodiment 1, an embodiment 2 and modifications thereof. As shown in FIG. 41, a Zener diode is formed by alternately forming p-type semiconductor layers and n-type semiconductor layers in the form of rings.

FIG. 42 is a longitudinal sectional view of the Zener diode taken along the line I–II in FIG. 41. FIG. 43 is a longitudinal sectional view of an n-type diffusion region (n-type semiconductor layer) of the Zener diode taken along the line III–IV in FIG. 41.

As shown in FIGS. 41 to 43, an n-type second semiconductor substrate 2 containing low-concentration n-type impurities is formed on an n-type first semiconductor substrate 1 containing high-concentration n-type impurities by epitaxy. The substrates 1 and 2 form an n-type base semiconductor layer. Further, an insulator film 3 of an oxide film or the like is formed on the base semiconductor layer (1, 2). An input protection circuit is formed on a base layer defined by the base semiconductor layer (1, 2) and the insulator film 3 by the following manufacturing method: A polysilicon layer 4 is formed on the base layer, for successively forming an n-type semiconductor layer 4b1 having a square cross-sectional or planar shape, a p-type semiconductor layer 4a1 having a ring cross-sectional shape, a ring-shaped n-type semiconductor layer 4b2, a ring-shaped p-type semiconductor layer 4a2 and a ring-shaped n-type semiconductor layer 4b3 in the polysilicon layer 4 to enclose a gate pad formed after formation of the Zener diode. Thus, a bidirectional Zener diode having a plurality of p-n junction surfaces is formed as the input protection circuit.

Thereafter the Zener diode is overcoated with an interlayer isolation film 5, and contact holes 6a and 6b are provided on portions located immediately above the innermost n-type semiconductor layer 4b1 and the outermost n-type semiconductor layer 4b3 of the ring-shaped Zener diode respectively for bringing the n-type semiconductor layers 4b1 and 4b3 into ohmic contact with a gate electrode layer 7a and a source electrode layer 7b through the contact holes 6a and 6b respectively. Thereafter another interlayer isolation film (not shown) is formed on the gate electrode layer 7a and the source electrode layer 7b and an opening is formed in part of this interlayer isolation film located on the gate electrode layer 7a, thereby partially exposing the gate electrode layer 7a. The exposed part of the gate electrode 7a defines the aforementioned gate pad.

A reverse withstand voltage of the aforementioned Zener diode is set to a desired value by adjusting the number of the p-type and n-type semiconductor layers forming the Zener diode or adjusting the impurity concentrations of the p-type and n-type semiconductor layers.

For example, Japanese Patent Application Laid-Open Gazettes Nos. 7-321305 (1995), 8-288525 (1996) and 9-97901 (1997) disclose a Zener diode having a structure corresponding to such a longitudinal sectional structure.

The input protection circuit having the aforementioned structure protects the gate insulator film of the MOS structure semiconductor element against a surge current or static electricity. However, the effect of the conventional input protection circuit for protecting the gate insulator film cannot still be said sufficient since the value of parasitic resistance of the diode in the conventional input protection circuit is unignorably large due to the specification of the apparatus. Consider that surge takes place, for example. Also when feeding a surge current from the gate electrode toward the source electrode through the aforementioned diode at this time, a voltage determined by the product of the parasitic resistance value of the diode and the surge current is applied across the diode, to cause remarkable deterioration in characteristics of the gate oxide film as the case may be. In other words, it follows that characteristic deterioration of the gate oxide film readily takes place as the parasitic resistance value of the diode is increased regardless of the surge current flowing to the diode, to remarkably damage the function of the diode serving as the input protection circuit.

Such a problem is caused also when static electricity is generated in the MOS structure semiconductor element.

It is well known that the parasitic resistance value of the diode is inversely proportionate to the peripheral length (corresponding to the length of the diode or each semiconductor region shown in FIG. 41 in a peripheral direction PD) of the diode and the thickness of the polysilicon layer in each p-n junction surface and proportionate to the width (corresponding to the length in a direction perpendicular to the peripheral direction PD) of each semiconductor region in the diode.

Therefore, the peripheral length of the diode or the thickness of the polysilicon layer may be increased or the width of each semiconductor region may be reduced thereby reducing the parasitic resistance value of the diode and improving the function of the diode serving as the input protection circuit.

When simply increasing the peripheral length of the diode, however, a new problem arises to enlarge the chip size. When the area occupied by the diode itself, inclusive of the area occupied by the gate pad, is increased, the peripheral length of the diode is also increased in response thereto, while activation regions of the MOS transistors are narrowed to result in such a problem that the number of the MOS transistors cannot be increased to a necessary level. Occurrence of such a problem is serious particularly in a semiconductor device originally having a small chip size.

While increase of the thickness of the polysilicon films employed for the diode brings reduction of manufacturability, while such a structural restriction results from increase of the thickness of the polysilicon layers that each semiconductor region must be elongated along the width in order to cope with increase of transverse diffusion of p-type and n-type impurities in the diode.

When narrowing the widths of the p-type and n-type semiconductor regions in the diode, further, it follows that voltage resistance is deteriorated due to reach-through, and hence this countermeasure cannot be preferable either.

SUMMARY OF THE INVENTION

According to a first aspect of the present invention, a semiconductor device comprises a base layer and a diode arranged on an upper surface of the base layer, while the diode comprises a plurality of semiconductor regions extending in a first direction respectively and successively forming p-n junctions in a second direction perpendicular to the first direction, the conductivity type of a first semiconductor region located on the side of a first end in the second direction among the plurality of semiconductor regions of the diode is equal to the conductivity type of a second semiconductor region located on the side of a second end opposed to the first end, and the interface between the base layer and the diode in the upper surface of the base layer comprises a plurality of groove portions having a depth in a third direction perpendicular to the first direction and the second direction, extending in the second direction and successively arranged in the first direction.

According to a second aspect of the present invention, at least one of the plurality of semiconductor regions of the diode comprises an irregular portion having an irregular shape defined by the plurality of groove portions of the interface.

According to a third aspect of the present invention, at least one of the plurality of semiconductor regions of the diode comprises an upper surface having a flat portion opposed to a bottom surface of each of the plurality of groove portions of the interface in the third direction.

According to a fourth aspect of the present invention, the base layer comprises a base semiconductor layer of a prescribed conductivity type and an insulator film arranged on an upper surface of the base semiconductor layer, and the insulator film comprises an upper surface opposed to an interface between the base semiconductor layer and the insulator film in the third direction and corresponding to the interface between the base layer and the diode.

According to a fifth aspect of the present invention, each of the plurality of groove portions is defined as a first groove portion, and the interface between the base semiconductor layer and the insulator film comprises a plurality of second groove portions each opposed to the first groove portion.

According to a sixth aspect of the present invention, a first thickness of the insulator film arranged on a portion of the interface between the base semiconductor layer and the insulator film held between two adjacent second groove portions among the plurality of second groove portions in the third direction is larger than a second thickness of the insulator film arranged on a bottom surface of each of the plurality of second groove portions in the third direction.

According to the sixth aspect, the parasitic resistance of the diode can be further reduced, and the protective function for the gate insulator film can be further improved.

According to a seventh aspect of the present invention, the prescribed conductivity type of the base semiconductor layer is a first conductivity type, and the base layer further comprises a plurality of semiconductor well regions of a second conductivity type extending from a portion located under a bottom surface of each of the plurality of groove portions in the interface between the base semiconductor layer and the insulator film into the base semiconductor layer.

According to the seventh aspect, the voltage resistance of the semiconductor device can be improved.

According to an eighth aspect of the present invention, the semiconductor device further comprises a MOS transistor structure, comprising a gate electrode and a main electrode, arranged on a second region in the upper surface of the base layer when defining a portion of the upper surface of the base layer provided with the diode as a first region, while the first semiconductor region is electrically connected with the gate electrode and the second semiconductor region is electrically connected with the main electrode.

According to a ninth aspect of the present invention, a method of manufacturing a semiconductor device comprises steps of forming an insulator film on a semiconductor substrate, forming an irregular portion on the insulator film, forming a semiconductor film on the insulator film comprising the irregular potion and alternately forming a p-type semiconductor region and an n-type semiconductor region in the semiconductor film in prescribed order thereby forming a diode of a multilayer structure.

According to the first, second, third, fourth, eighth and ninth aspects, the diode can have a peripheral length not only in the transverse direction but also in the vertical direction although the area occupied by the diode as viewed from above is identical to that of the prior art, whereby the peripheral length of the diode is increased, the area of a p-n junction surface is responsively increased, the sectional area of a path for a surge current is increased, and parasitic resistance is remarkably reduced. Therefore, a clamping effect of the diode is increased to improve surge resistance, and the function of protecting the gate insulator film is improved.

According to a tenth aspect of the present invention, a method of manufacturing a semiconductor device comprises steps of forming an irregular portion on a semiconductor substrate, forming an insulator film on a surface of the semiconductor substrate comprising the irregular portion, forming a semiconductor film on the insulator film and alternately forming a p-type semiconductor region and an n-type semiconductor region in the semiconductor film in prescribed order thereby forming a diode of a multilayer structure.

According to the fifth and tenth aspects, the parasitic resistance of the diode can be further reduced, and the protective function for the gate insulator film can be further improved.

An object of the present invention is to provide a semiconductor device capable of reducing the area of a Zener diode for an input protection circuit and improving an input protection function.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 2 and 3 are longitudinal sectional views showing the structure of the first region of the semiconductor device according to the embodiment 1 of the present invention;

FIG. 4 is a graph showing change of the voltages of a gate insulator film following change of a surge current;

FIGS. 12 and 13 are longitudinal sectional views showing modifications of the structure shown in FIG. 10;

FIGS. 15(A) to 26(C) are longitudinal sectional views showing steps of manufacturing a semiconductor device according to an embodiment 2 of the present invention;

DESCRIPTION OF THE PREFERRED EMBODIMENTS

Embodiment 1

According to an embodiment 1 of the present invention, a Zener diode made of a base material of polysilicon is formed on the first region in the layout of FIG. 40 as an input protection circuit for a MOS transistor structure described later, while MOS transistor structures each consisting of a DMOSFET (planar MOSFET), which is one of vertical power MOSFETs, are formed on the second region. An interface between the Zener diode and a base layer has a plurality of groove portions having a depth in a third direction D3 perpendicular to first and second directions D1 and D2 described later, extending in the aforementioned second direction D2 and successively arranged in the aforementioned first direction D1. Therefore, each semiconductor region or each diffusion region forming the diode has an irregular shape defined by each groove portion of the aforementioned interface. The term "irregular shape" stands for such a structure that both of concave and convex portions depressed and projected in the third direction D3 respectively extend in the second direction D2 while the concave and convex portions are alternately arranged in the first direction D1. The characteristic structure of a semiconductor device 100 having the MOS transistor structure and the input protection circuit therefor according to this embodiment is now described with reference to drawings.

Figure 1:
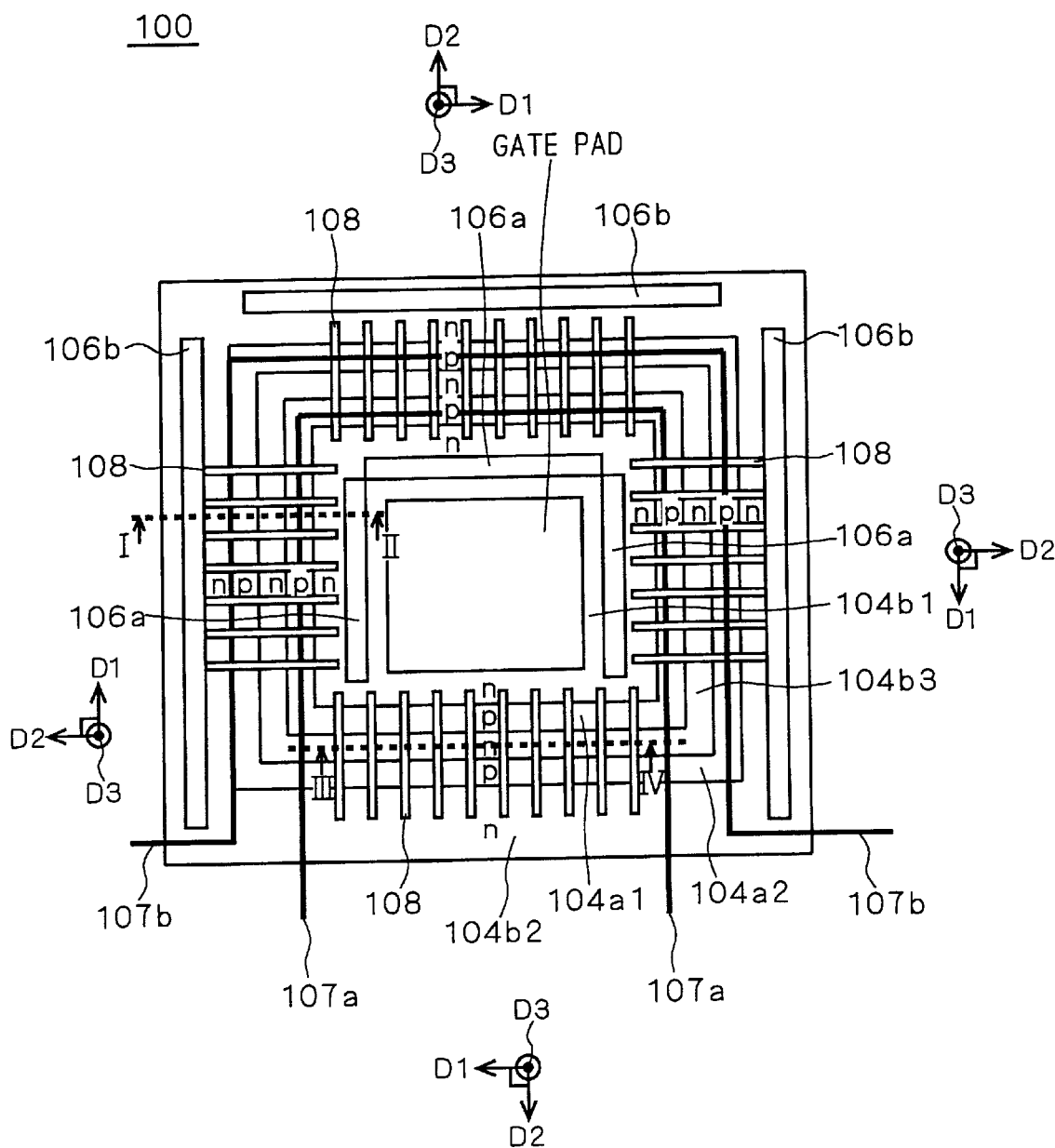
FIG. 1 is a top plan view showing the structure of a first region of a semiconductor device according to an embodiment 1 of the present invention.
Figure 40:
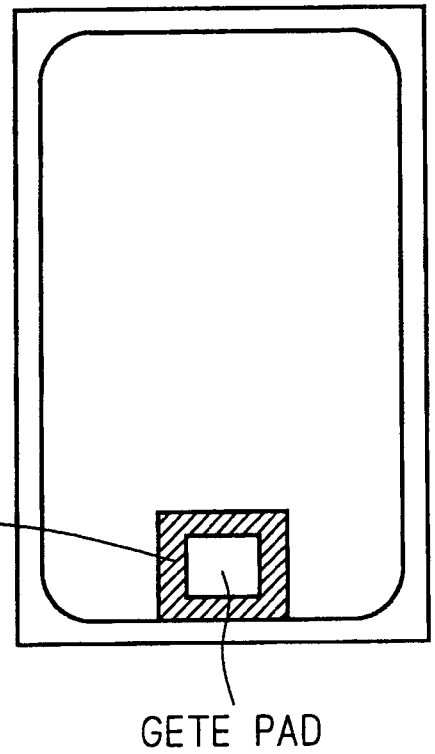
FIG. 40 is a top plan view showing the layout of a semiconductor device including the input protection Zener diode.
Figure 41:
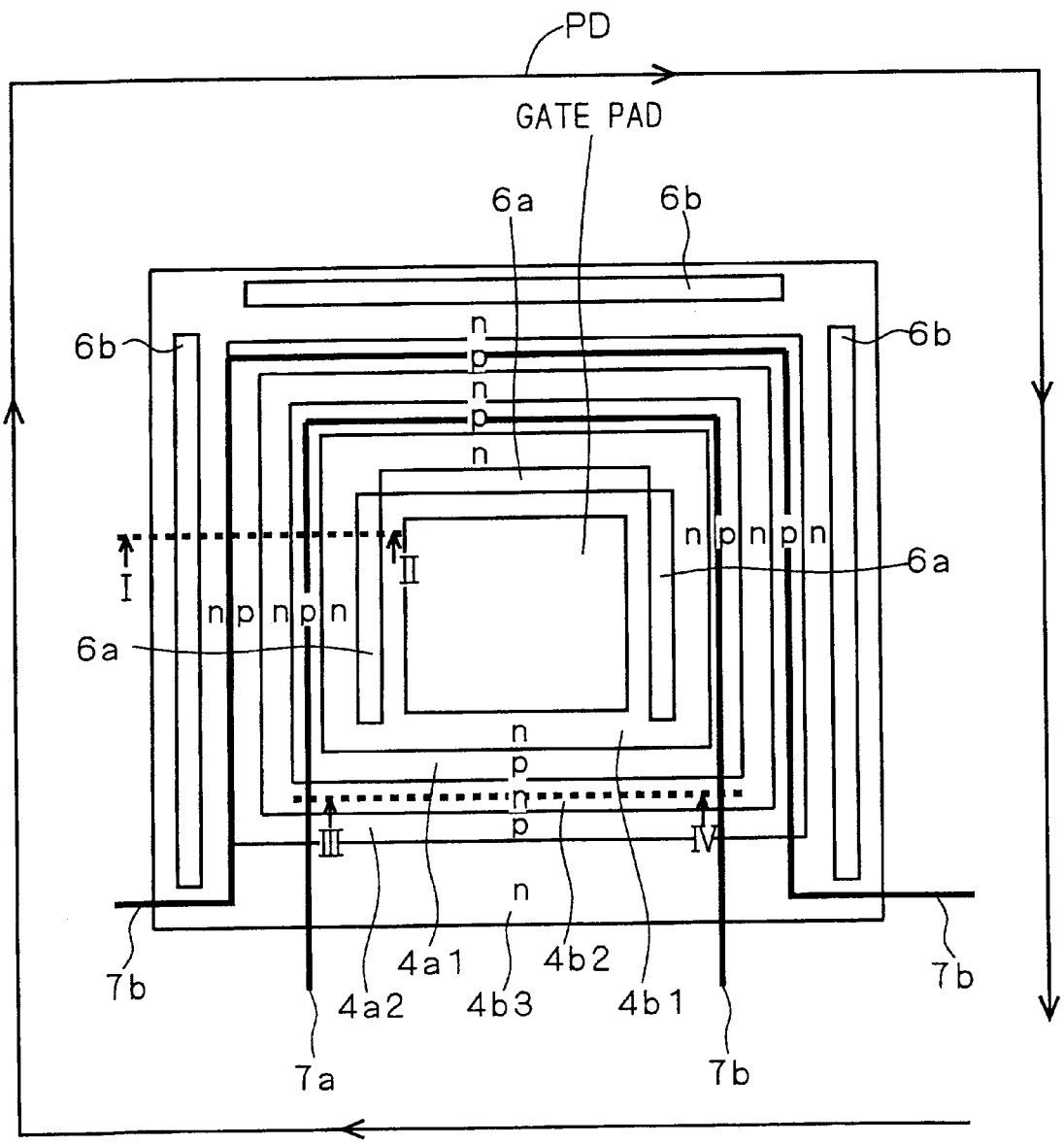
FIG. 41 is a top plan view showing a conventional input protection Zener diode.
Figure 42:
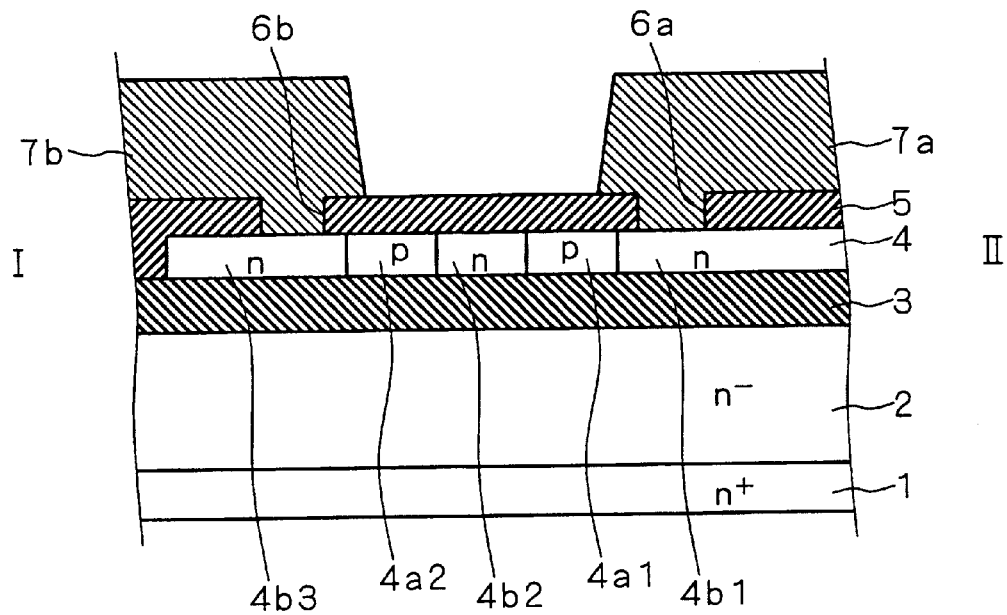
FIGS. 42 and 43 are longitudinal sectional views showing the conventional input protection Zener diode.
Figure 43:
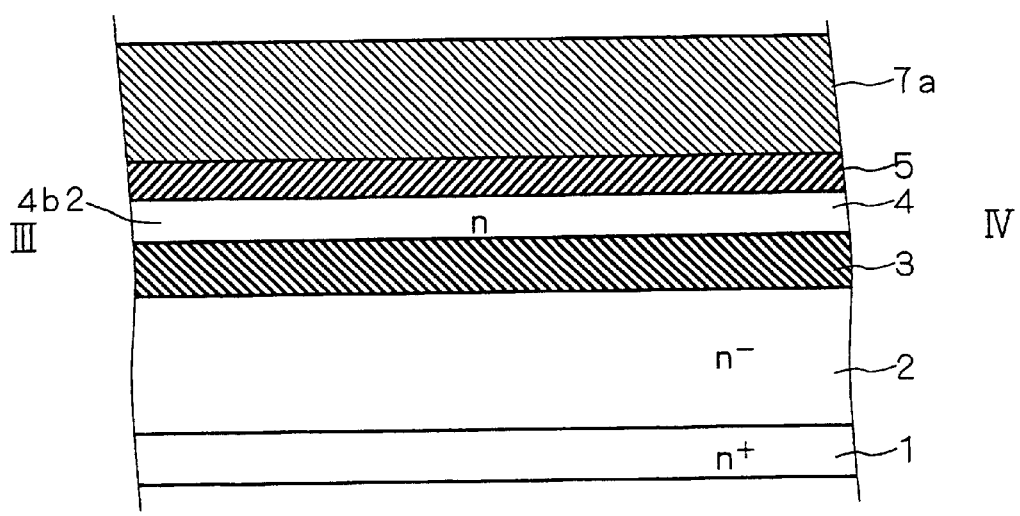

FIG. 1 is a top plan view schematically showing a part (or a first region structure) of the semiconductor device 100 according to this embodiment forming the input protection circuit hatched in FIG. 40 in an enlarged manner. For convenience of illustration, FIG. 1 shows grooves 108, which are essentially invisible from above, with solid lines. FIG. 2 is a longitudinal sectional view of a Zener diode and a base layer 111 (101, 102 and 103) located immediately under the same, taken along the line I–II in FIG. 1. FIG. 3 is a longitudinal sectional view of an n-type semiconductor region 104b3, arranged on an intermediate position among five semiconductor regions forming the Zener diode, and the base layer 111 (101, 102 and 103) located immediately under the same, taken along the line II–IV in FIG. 1. The structures shown in FIG. 3 also apply to the structures of each of the remaining four semiconductor regions 104b1, 104a1, 104a2 and 104b2 forming the Zener diode and the base layer 111 (101, 102 and 103) located immediately under the same.

The structures of the Zener diode and the base layer 111 (101, 102 and 103) located immediately under the same are now described with reference to FIGS. 1 to 3.

Figure 26:
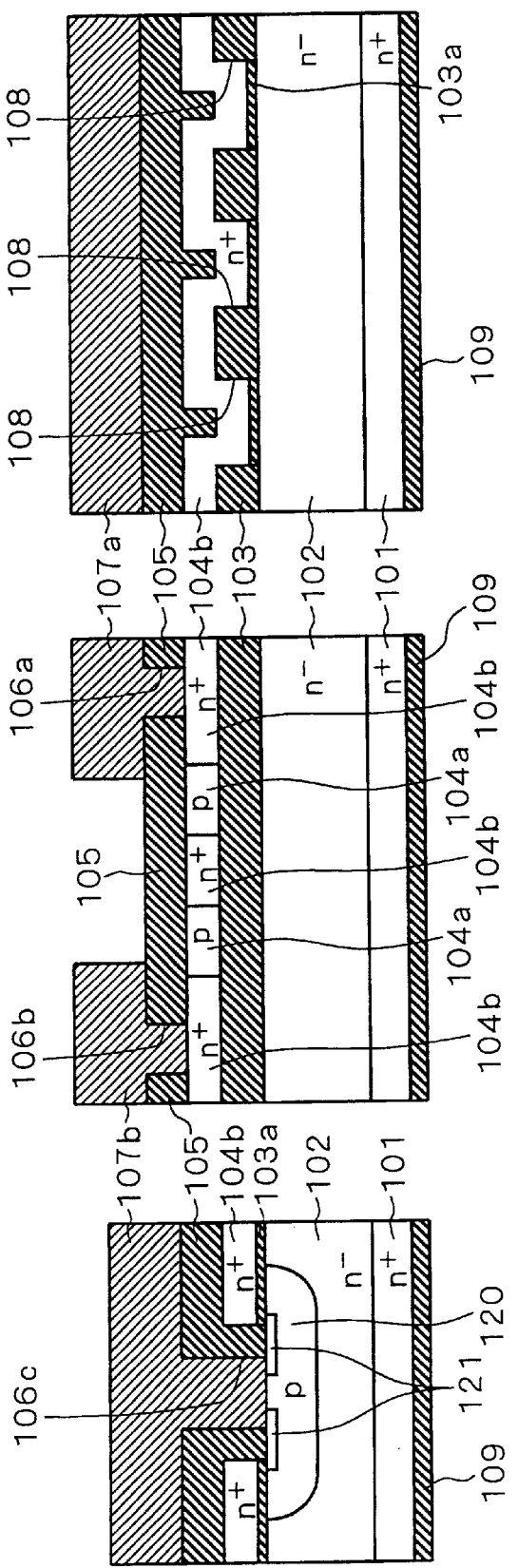

First, the structure of the base layer 111 (101, 102 and 103) defining the first region is described. On a first semiconductor layer 101 which is a high-concentration n$^+$ substrate containing n-type impurities (the n-type is referred to as a first conductivity type) for forming a drain region of the DMOSFET, a second semiconductor layer 102 which is an epitaxial layer containing low-concentration n-type impurities is arranged. In this embodiment, a semiconductor substrate formed by the first and second semiconductor layers 101 and 102 is referred to as a base semiconductor layer 110 of the first conductivity type (corresponding to the prescribed conductivity type). This definition also applies to a portion formed by the first and second semiconductor layers 101 and 102 in the second region (see FIG. 26(A) described later).

Further, an insulator film 103 is arranged on an upper surface 110S of the base semiconductor layer 110. In this embodiment, the portion formed by the insulator film 103 and the base semiconductor layer 110 is referred to as the base layer 111. The insulator film 103 consists of i) a first portion 103b forming a principal part of the insulator film 103 and having a uniform thickness Ti and ii) a plurality of second portions 103a each forming a single groove 108 in the insulator film 103 and having a uniform thickness T2 smaller than the thickness T1. Therefore, a part of the first portion 103b held between each adjacent pair of second portions 103a defines a convex portion projecting in the third direction D3. The height of an upper surface 103bS of this convex portion 103b from upper surfaces 103aS of the second portions 103a corresponds to the depth T3 of the groove 108, which is smaller than the thickness T1 and larger than the thickness T2. The upper surfaces 103aS of the second portions 103a are opposed to the interface 110S between the base semiconductor layer 110 and the insulator film 103 in the third direction D3. In this embodiment, the upper surface 103aS of each second portion 103a, the part of the upper surface 103bS of the first portion 103b forming each convex portion, side wall surfaces of each groove 108 and parts of the upper surface 103bS of the first portion 103b, excluding the aforementioned convex portions, forming flat portions define an upper surface 111S of the base layer 111.

The feature of this embodiment resides in the structure of the plurality of grooves 108. As shown in FIGS. 1 to 3, each groove 108 extends in the second direction D2. The second direction D2 corresponds to a direction where n-type and p-type semiconductor regions forming the Zener diode (hereinafter simply referred to as a diode) described later are alternately arranged in prescribed order or a direction where p-n junction surfaces in the diode are arranged. According to this embodiment, the grooves 108 extend in the second direction D2 over such a range that all semiconductor regions forming the diode can fill up the grooves 108. Further, the plurality of grooves 108 are successively arranged along the first direction D1 perpendicular to the second direction D2 at constant intervals W1. Widths W2 of the bottom surfaces 103aS of the grooves 108 in the first direction D1 are equal to each other. The first direction D1 corresponds to a direction where the semiconductor regions forming the diode extend, i.e., the peripheral direction of the diode. The third direction D3, perpendicular to the first and second directions D1 and D2, corresponds to the direction of the thickness of the base semiconductor layer 110.

The structure of the diode, which is an input protection circuit provided between the gate and the source of the DMOSFET, is now described. The diode is arranged on the upper surface 111S. of the base layer 111 or the upper surface of the insulator film 103. This diode, formed by a polysilicon layer 104 serving as the base material, defines a bidirectional Zener diode having an npnpn structure as shown in FIGS. 1 and 2. Further, the diode consists of a plurality of semiconductor regions formed by alternately doping the polysilicon layer 104 with n-type and p-type impurities in the form of rings to enclose a gate pad. In other words, the diode is formed by an n-type semiconductor region 104b1 located on the central portion of the diode with a square cross-sectional or planar shape, a p-type semiconductor region 104a1 formed along the outer periphery of the n-type semiconductor region 104b1 with a ring cross-sectional shape, an n-type semiconductor region 104b3 formed along the outer periphery of the p-type semiconductor region 104a1 with a ring cross-sectional shape, a p-type semiconductor region 104a2 formed along the outer periphery of the n-type semiconductor region 104b3 with a ring cross-sectional shape and an n-type semiconductor region 104b2 formed along the outer periphery of the p-type semiconductor region 104a2 with a ring cross-sectional shape. More in detail, the respective ones of the plurality of semiconductor regions 104b1, 104a1, 104b3, 104a2 and 104b2 located on the respective sides of the upper, right, lower and left portions of FIG. 1 showing the diode extend in the first direction D1, and successively form p-n junctions in the second direction D2. In addition, the conductivity type of the first semiconductor region 104b1 located on a first end in the second direction D2 is equal to that of the second semiconductor region 104b2 located on a second end opposed to the aforementioned first end. According to this embodiment, further, thicknesses TD of the semiconductor regions 104b1, 104a1, 104b3, 104a2 and 104b2 are substantially uniform along the first direction D1, and equal to each other. Thus, the diode is formed by the ring-shaped plurality of semiconductor regions, whereby the peripheral length of the diode can be set long in the peripheral direction D1.

Further, the insulator film 103 located immediately under each of the plurality of semiconductor regions 104b1, 104a1, 104b3, 104a2 and 1042 located on the respective side portions has the plurality of grooves 108 arranged in the first direction D1 or an irregular portion consisting of a plurality of irregular shapes defined by the plurality of grooves 108, as hereinabove described. Therefore, the respective semiconductor regions 104b1, 104a1, 104b3, 104a2 and 104b2 on the respective side portions are directly arranged on the aforementioned irregular portion, to have irregular shapes corresponding to those of the insulator film 103, as illustrated in FIG. 3.

On parts of the upper surface 111S of the insulator film 103 not provided with the diode and upper and side surfaces of the diode, an interlayer oxide film or interlayer isolation film 105 is arranged. Further, a first contact hole 106a is formed in a part of the interlayer isolation film 105 located on a portion closer to the p-n junction surface in the upper surface of the first semiconductor region 104b1 whose cross section is not ring-shaped but square (see FIG. 1). Similarly, a second contact hole 106b is formed in a part of the interlayer isolation film 105 located on a portion closer to the p-n junction surface in the upper surface of the ring-shaped second semiconductor region 104b2 whose cross section has four corners. The first semiconductor region 104b1 is electrically connected with an aluminum wire or gate electrode layer 107a filling up the first contact hole 106a, while the second semiconductor region 104b2 is similarly electrically connected with an aluminum wire or source electrode layer (main electrode layer) 107b filling up the second contact hole 106b.

Another interlayer isolation film (not shown) is arranged on the upper surfaces of the gate electrode layer 107a and the source electrode layer 107b, and an opening (not shown) is formed in a part of this interlayer isolation film located above a central region in the upper surface of the first semiconductor region 104b1 . An exposed upper surface portion of the gate electrode layer 107a corresponding to the bottom surface of this opening corresponds to the aforementioned gate pad.

The input protection circuit having the aforementioned structure can set the reverse withstand voltage of the diode in response to the number of the p-n junction surfaces of the diode. When the reverse withstand voltage of one p-n junction surface is 8 V, for example, the overall reverse withstand voltage of the diode, having two p-n junction surfaces in reverse-biased states, is 16 V.

As hereinabove described, the interface between the base layer 111 and the diode in the upper surface 111S of the base layer 111 or that between the insulator film 103 and the diode in the upper surface of the insulator film 103 partially comprises the plurality of grooves 108 having the prescribed depth T3, extending along the second direction D2 in the range from the first semiconductor region 104$b$1 up to the second semiconductor region 104$b$2 and successively arranged in the first direction D1.

Consequently, it follows that the respective semiconductor regions 104$b$1, 104$a$1, 104$b$3, 104$a$2 and 104$b$2 of the diode are directly arranged on the grooves 108 extending in the direction D2 perpendicular to the peripheral direction D1 to present irregular shapes. Therefore, it follows that the Zener diode or each of the semiconductor regions 104$b$1, 104$a$1, 104$b$3, 104$a$2 and 104$b$2 has a peripheral length not only in the transverse direction (the peripheral direction D1) but also in the vertical direction (the third direction D3) and the area of each p-n junction surface in the diode is increased due to the increase of the vertical peripheral length, to increase the sectional area of a path for a surge current and to reduce parasitic resistance in the diode.

When the parasitic resistance value of the Zener diode forming the input protection circuit is reduced in the aforementioned manner, the following effect is attained: When the surge current flows from the gate electrode to the source electrode, voltage responsive to the product of the parasitic resistance value of the diode and the surge current is generated. Therefore, the total voltage (breakdown voltage) applied to a gate insulator film is decided by the following relational expression:

breakdown voltage=initial withstand voltage+breakdown current× parasitic resistance value In the input protection circuit according to this embodiment, however, the area of the p-n junction surface where the surge current flows is larger than that in the prior art having the peripheral length only in the transverse direction, and hence the parasitic resistance value is reduced in response. As shown in FIG. 4, therefore, the voltage (shown by a dotted line in FIG. 4) applied to the gate insulator film in this embodiment when the surge current is increased is smaller than the voltage (shown by a solid line in FIG. 4) applied to a gate insulator film in the input protection circuit having the conventional structure, and the diode according to this embodiment is improved in a clamping effect as well as the function for protecting the gate insulator film.

<Additional Remarks>

(1) While the widths W2 of the grooves 108 are identical to each other in the example shown in FIGS. 1 to 3, the grooves 108 may be set to have different widths, or the widths of the grooves 108 may be set to arbitrary values.

(2) The arrangement pitches W1 for the grooves 108 may not be regularly set identical as in the example shown in FIGS. 1 to 3, but may be set to differ from each other (arbitrary values).

(3) The depths T3 of the grooves 108 may not necessarily be set identical either.

(4) The plurality of grooves 108 may be provided on a portion of the upper surface of the insulator film 103 located immediately under at least one of the semiconductor regions 104$b$1, 104$a$1, 104$b$3, 104$a$2 and 104$b$2 of the Zener diode. In this case, it follows that only at least one semiconductor region has irregular shapes in relation to the peripheral direction D1.

(5) Only a single groove 108 may be provided on the interface between the insulator film 103 and the diode, in place of the plurality of grooves 108.

(6) The plurality of grooves 108 may be provided only on a part of the upper surface 111S of the insulator film 103 located immediately under at least one of the upper, right, lower and left side portions of the ring-shaped diode as viewed from above in FIG. 1.

Figure 5:
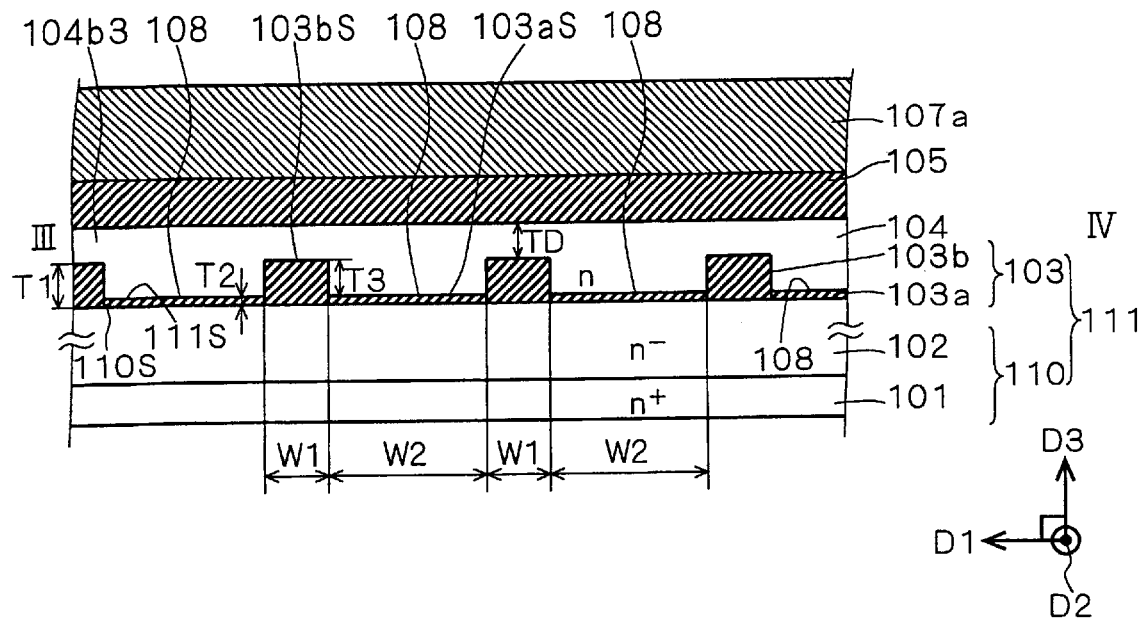
FIG. 5 is a longitudinal sectional view showing a modification of the structure shown in FIG. 3.

(7) As illustrated in FIG. 5 corresponding to the longitudinal sectional view of FIG. 3, the thicknesses of the semiconductor regions 104$b$1, 104$a$1, 104$b$3, 104$a$2 and 104$b$2 of the diode in the first direction D1 may be so set that parts of the upper surfaces of the semiconductor regions 104$b$1, 104$a$1, 104$b$3, 104$a$2 and 104$b$2 opposed to the upper surface 103$a$S of the second portion 103$a$ of the insulator film 103 or the bottom surfaces of the grooves 108 in relation to the third direction D3 are substantially flat. In this case, irregular portions are formed on the lower surface (interface) side portions of the semiconductor regions 104$b$1, 104$a$1, 104$b$3, 104$a$2 and 104$b$2, whereby it follows that the semiconductor regions 104$b$1, 104$a$1, 104$b$3, 104$a$2 and 104$b$2 have peripheral lengths also in the vertical direction, to attain a similar effect.

<Modification 1 of Embodiment 1>

In the principal example of the embodiment 1 shown in FIGS. 1 to 3, the Zener diode is arranged on the upper surface 111S of the insulator film 103 having the plurality of grooves 108. In other words, the insulator film 103 defines a surface part of the base layer 111 having the plurality of grooves 108, while the upper surface 110S of the base semiconductor layer 110 is flat.

In place of this, a modification 1 of the embodiment 1 employs such a structure that the interface between a base semiconductor layer 110 and an insulator film 103 substantially defines a surface part of a base layer 111 having a plurality of grooves in the upper surface 110S of the base semiconductor layer 110. In other words, the upper surface (interface) 110S of the base semiconductor layer 110 has a plurality of second grooves (grooves 201 described later) similar in structure to the aforementioned plurality of grooves 108, and the insulator film 103 having a uniform thickness is arranged on the upper surface 110S of the base semiconductor layer 110. Therefore, the upper surface 103$a$S of each part of the insulator film 103 (second portion 103$a$) arranged on the bottom and side wall surfaces of each second groove 201 defines a first groove 108A, opposed to the second groove 201, having a concave shape responsive to the shape of the second groove 201. Therefore, each semiconductor region of a diode arranged on the upper surface 111S of the insulator film 103 also has irregular shapes set on the basis of the shapes of the plurality of second grooves 201. The feature of this modification is now described in detail with reference to FIGS. 1 and 6.

Figure 6:
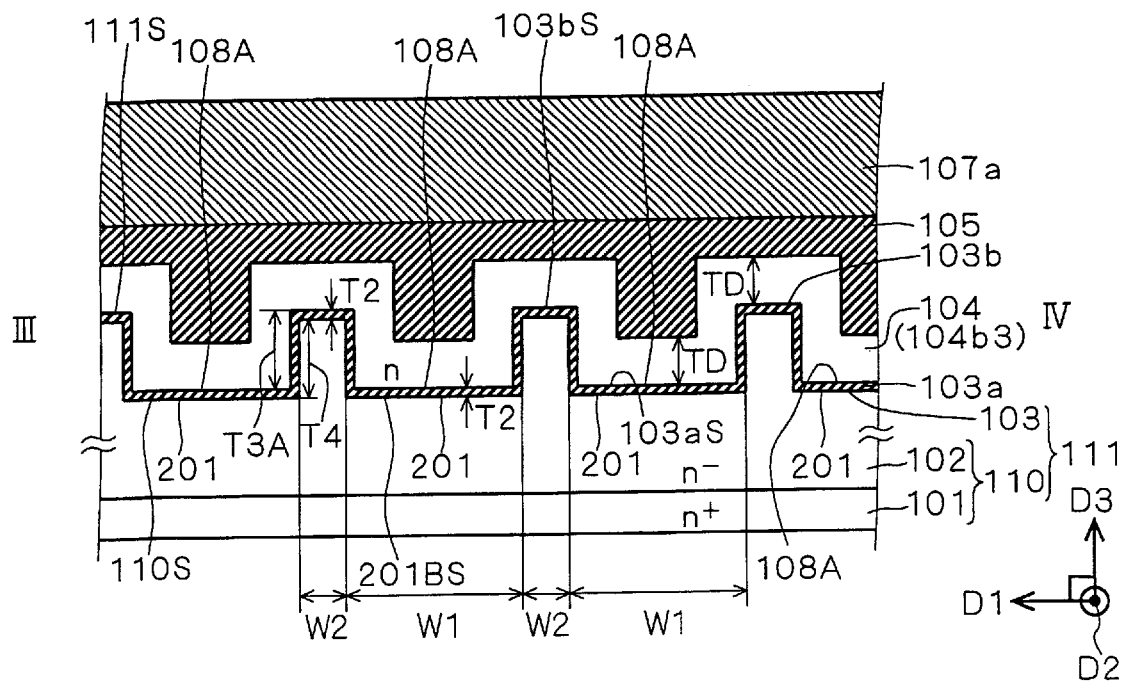
FIG. 6 is a longitudinal sectional view showing the structure of a first region of a semiconductor device according to a modification 1 of the embodiment 1 of the present invention.

FIG. 6, corresponding to FIG. 3, is a longitudinal sectional view showing the diode and the base layer 111 according to this modification. A longitudinal sectional view taken along a line corresponding to the line I–II in FIG. 1 corresponds to FIG. 2, except the thickness of the insulator film 103.

As shown in FIG. 6, the upper surface of an epitaxial layer 102 in a first region has the plurality of grooves 201 forming irregular shapes. Similarly to the grooves 108 illustrated in Rigs. 1 and 3, the respective ones of the plurality of grooves 201 have a prescribed depth T4 in a third direction D3 and extend within a range from a first semiconductor region 104$b$1 up to a second semiconductor region 104$b$2 along a second direction D2. The grooves 201 are successively arranged in a first direction D1. The insulator film 103 having a uniform thickness T2 is formed on the upper surface 110S of the epitaxial layer 102 partially forming such irregular shapes. In this modification, therefore, the thickness of first portions 103$b$ of the insulator film 103 arranged on convex portions of the epitaxial layer 102 and that of second portions 103$a$ arranged on concave portions (the grooves) 201 of the epitaxial layer 102 are equal to each other. The upper surface 111S of the insulator film 103 has the plurality of grooves 108A corresponding to the plurality of grooves 201. The Zener diode is arranged on the upper surface 111S of the insulator film 103, similarly to the embodiment 1.

An effect similar to that of the embodiment 1 can be attained by employing this structure, as a matter of course. Particularly according to this modification, it is possible to readily increase the depth of steps formed in the diode along the direction D2 perpendicular to the peripheral direction D1 or the depth T3A of the grooves 108A beyond the depth T3 of steps (irregular shapes) formed in the diode only by the grooves 108 of the insulator film 103 such as an oxide film as in the embodiment 1. Therefore, the peripheral length (particularly the vertical length) of the Zener diode can be further increased, whereby parasitic resistance can be further reduced. This is because the grooves 201 are formed with respect to the epitaxial layer 102 by far larger in thickness than the insulator film 103 in this modification, and hence the grooves 201 deeper than the depth T3 (FIG. 3) of the grooves 108 formed in the upper surface 111S of the insulator film 103 can be readily formed in the upper surface 110S of the epitaxial layer 102.

Figure 7:
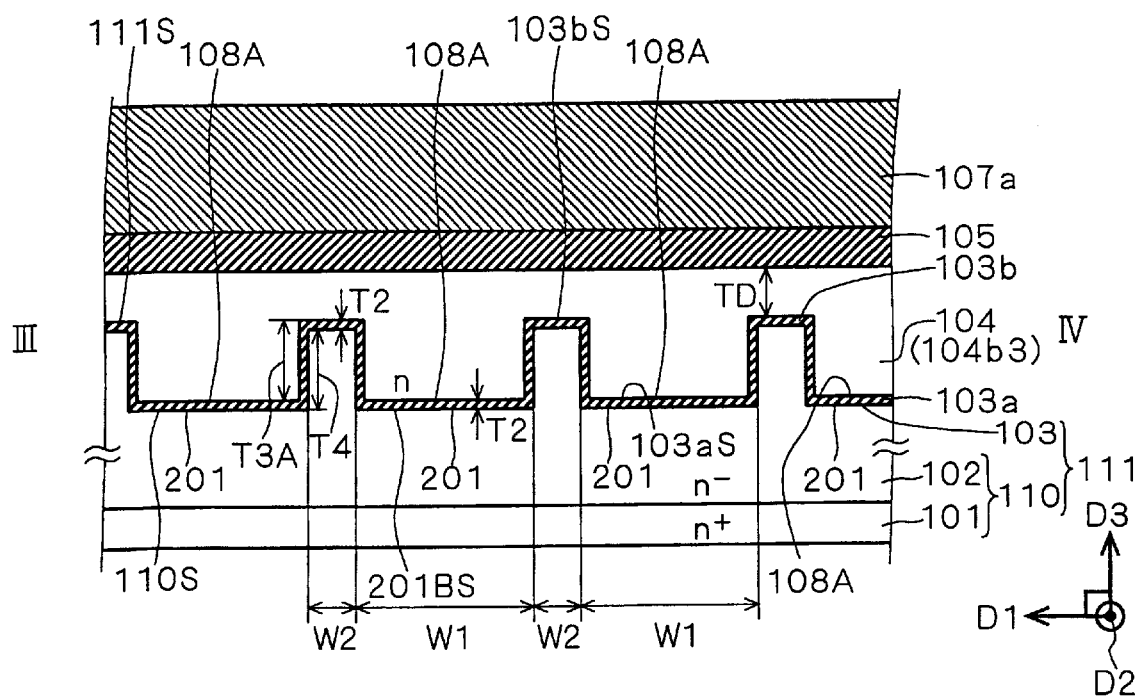
FIG. 7 is a longitudinal sectional view showing a modification of the structure shown in FIG. 6.

Each of the additional remarks (1) to (7) described with reference to the embodiment 1 also applies to this modification. In particular, FIG. 7 is a longitudinal sectional view taken along the line III–IV (see FIG. 1) in the case of applying the additional remark (7) to this modification.

<Modification 2 of Embodiment 1>

The feature of a modification 2 of the embodiment 1 resides in that the features described with reference to the embodiment 1 and the modification 1 of the embodiment 1 are combined with each other to implement a first region structure. The structure of a first region according to this modification is now described with reference to FIG. 8 showing a longitudinal sectional view taken along the line III–IV (see FIG. 1).

Figure 8:
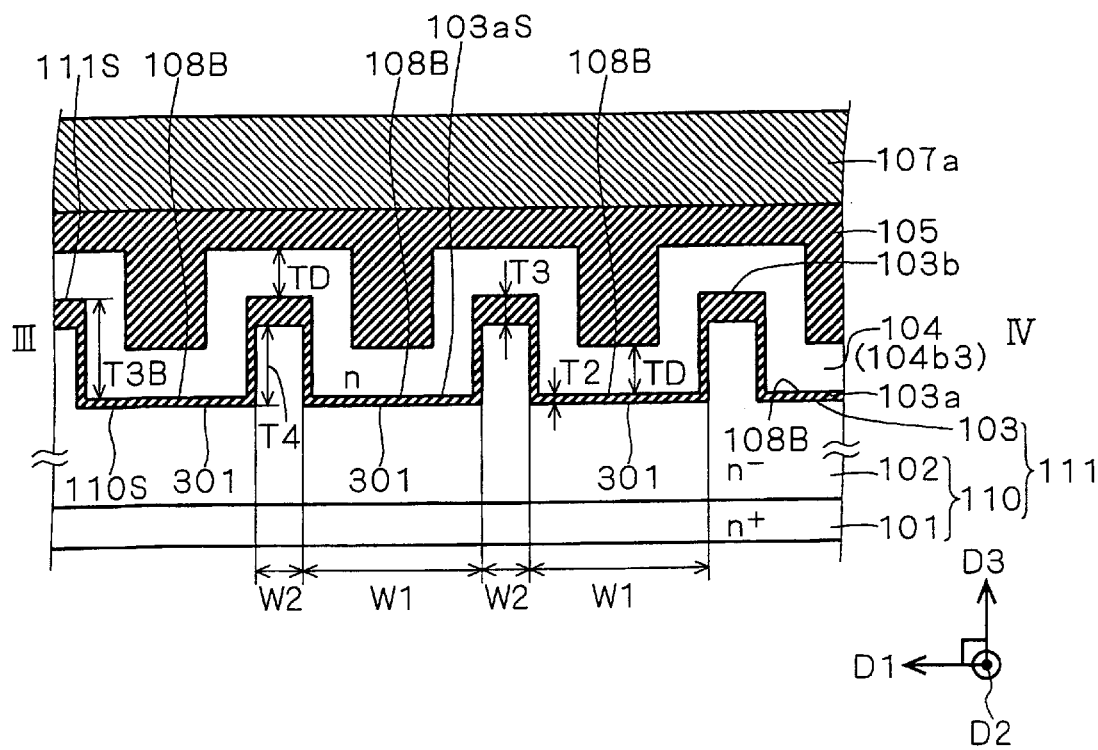
FIG. 8 is a longitudinal sectional view showing the structure of a first region of a semiconductor device according to a modification 2 of the embodiment 1 of the present invention.

As shown in FIG. 8, an insulator film 103 and an epitaxial layer 102 have a plurality of grooves 301 and 108B having depths T4 and T3B in a third direction D3 respectively, extending in a second direction D2 and arranged in a first direction D1 at prescribed pitches. In other words, the upper surface 110S of a base semiconductor layer 110 in the first region has the plurality of grooves 301 arranged in the first direction D1 at pitches or intervals W2. The grooves 301 having the depth T4 in the third direction D3 extend along the second direction D2, and are located under semiconductor regions 104$b$1, 104$a$1, 104$b$3, 104$a$2 and 104$b$2 identical to those shown in FIG. 1. The grooves 108B forming first groove portions are arranged in correspondence to the arrangement of the grooves (second groove portions) 301 having such a structure. In other words, the insulator film 103 is arranged on the upper surface 110S of the base semiconductor layer 110, while the thickness (first thickness) T3 of first portions 103$b$ located on top surfaces of convex portions held between adjacent ones of the grooves 301 is larger than the thickness (second thickness) T2 of second portions 103$a$ located on the bottom surfaces of the grooves 301. The thickness T3 is smaller than the depth T4. Therefore, the height from the bottom surfaces 103$a$S of the grooves 108B or the depth T3B is larger than the depth T3A of the grooves 108A in the modification 1.

Also in this modification, the semiconductor regions 104$b$1, 104$a$1, 104$b$3, 104$a$2 and 104$b$2 having a substantially uniform thickness TD in the first direction D1 are arranged on the upper surface 111S of the insulator film 103 having a continuous step structure or irregular structure defined by the plurality of grooves 108B.

According to this modification having such a structure, the depth of irregular portions formed in the diode along the direction D2 perpendicular to the peripheral direction D1 or the depth T3B of the grooves 108B can be readily set larger than the depths T3 and T3A of the irregular portions in the embodiment 1 and the modification 1thereof, whereby the peripheral length of the Zener diode can be further increased for further reducing parasitic resistance.

Figure 9:
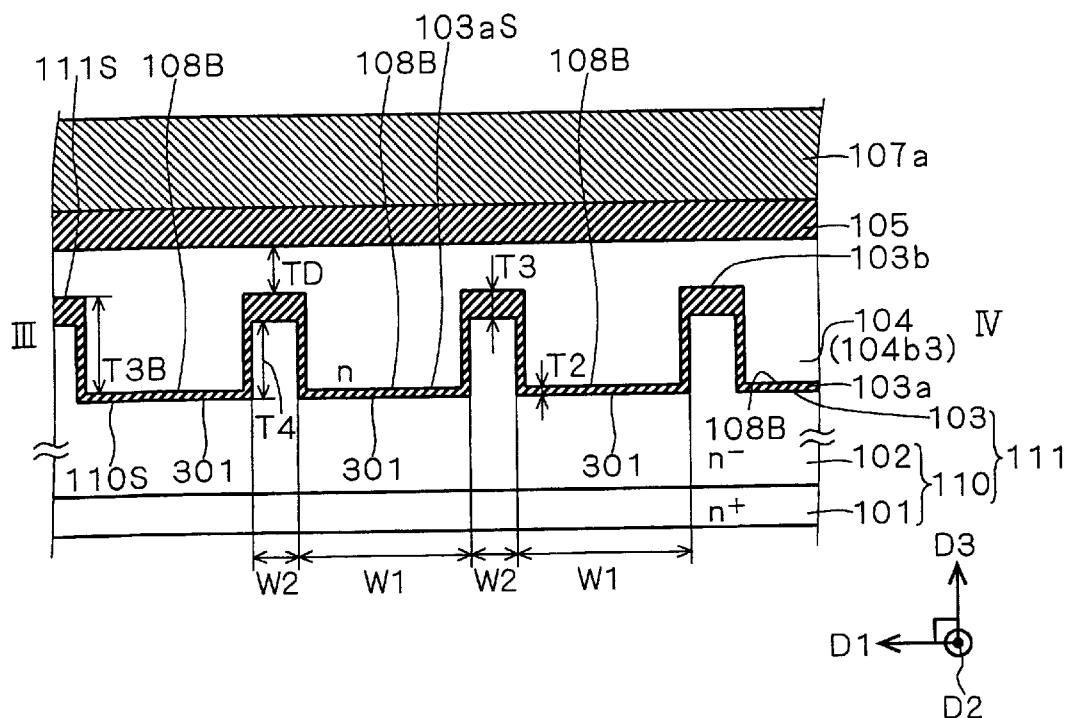
FIG. 9 is a longitudinal sectional view showing a modification of the structure shown in FIG. 8.

Each of the additional remarks (1) to (7) described with reference to the embodiment 1also applies to this modification. In particular, FIG. 9 is a longitudinal sectional view taken along the line III–IV (see FIG. 1) in the case of applying the additional remark (7) to this modification.

<Modification 3 of Embodiment 1>

In the Zener diode according to the embodiment 1, the epitaxial layer 102 in the first region is a semiconductor layer containing only n-type impurities.

Figure 10:
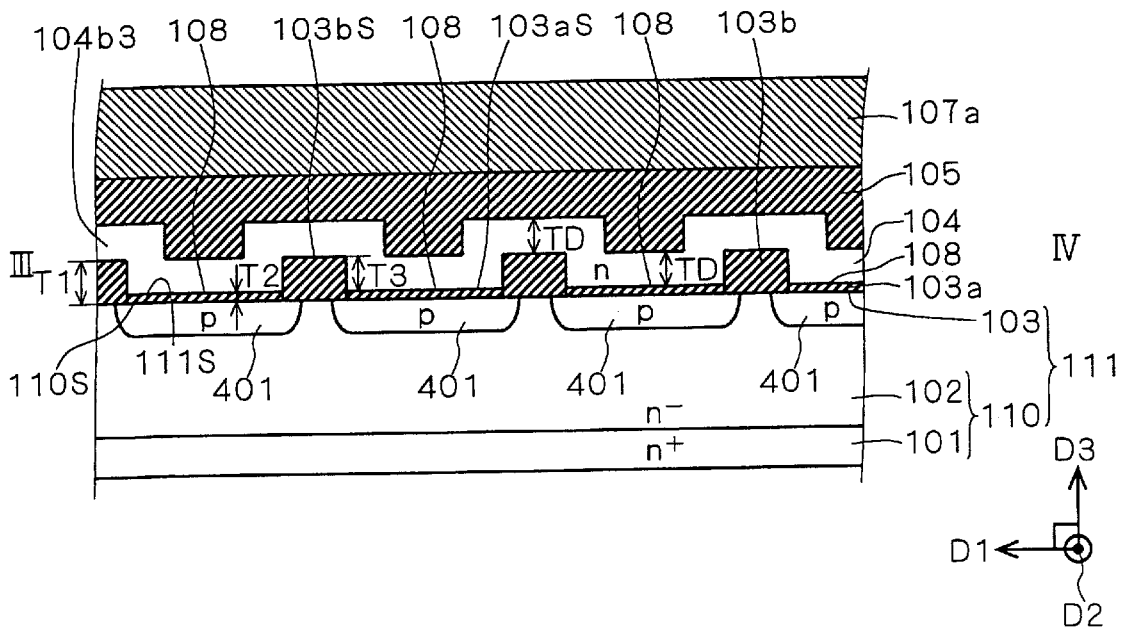
FIGS. 10 and 11 are longitudinal sectional views showing the structure of a first region of a semiconductor device according to a modification 3 of the embodiment 1 of the present invention.
Figure 11:
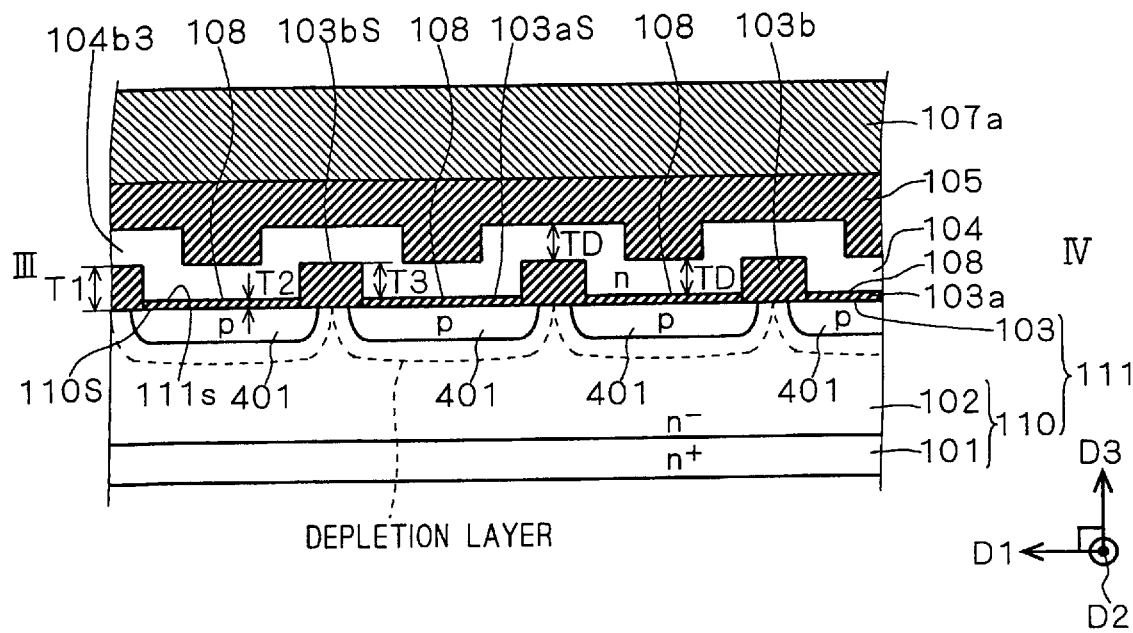

In a modification 3 of the embodiment 1, on the other hand, an n-type (first conductivity type) base semiconductor layer containing n-type impurities has a plurality of p-type (second conductivity type) well regions or body regions extending from parts of the interface between the base semiconductor layer and an insulator film located under the bottom surfaces of grooves into the base semiconductor layer. With reference to FIGS. 10 and 11 showing longitudinal sectional views taken along the line III–IV in FIG. 1, a case of applying the feature of this modification to the first region of the embodiment 1is described.

As shown in FIG. 10, a plurality of p base regions 401 (p-type semiconductor well regions) containing p-type impurities are formed in an epitaxial layer 102. Further, the p base regions 401 are arranged immediately under corresponding grooves 108, and extend in a second direction D2 only within the range of extension of the grooves 108 along the second direction D2. Therefore, ends of the p base regions 401 closer to a first semiconductor region 104$b$1 in the second direction D2 do not reach a part of the first semiconductor region 104$b$1 located immediately under a gate pad.

An effect identical to that attained in the embodiment 1 can be attained also when providing such a plurality of p base regions 401.

In the case of employing this structure, further, adjacent p base regions 401 are connected with each other through depletion layers (shown by dotted lines in FIG. 11) when a main withstand voltage is applied across a source and a drain of a DMOSFET as shown in FIG. 11, whereby the withstand voltage of the DMOSFET, i.e., the withstand voltage between the second semiconductor layer 102 and a p-type well region formed in this layer 102 in the second region (DMOS transistor structure region), can be effectively increased (see FIG. 26(A) described later). This advantage brings the following advantage in manufacturing steps: When a peripheral edge portion of the p-type well region in the second semiconductor layer 102 in the second region has a large curvature, field strength in the peripheral edge portion is so increased that the withstand voltage of the DMOSFET must be reduced. In order to avoid such inconvenience, the peripheral edge portion of the p-type well region in the second semiconductor layer 102 in the second region may be extended toward the first region. Thus, the curvature of the peripheral edge portion of the p-type well region can be reduced, while an additional step is required in this case for forming a single p-type well region having such a large occupied area in the second semiconductor layer 102. According to this modification, on the other hand, the plurality of p base regions 401 may be formed when forming the plurality of grooves 108, and hence it can be said that this modification is more advantageous when comparing both cases in consideration of manufacturing steps.

Figure 12:
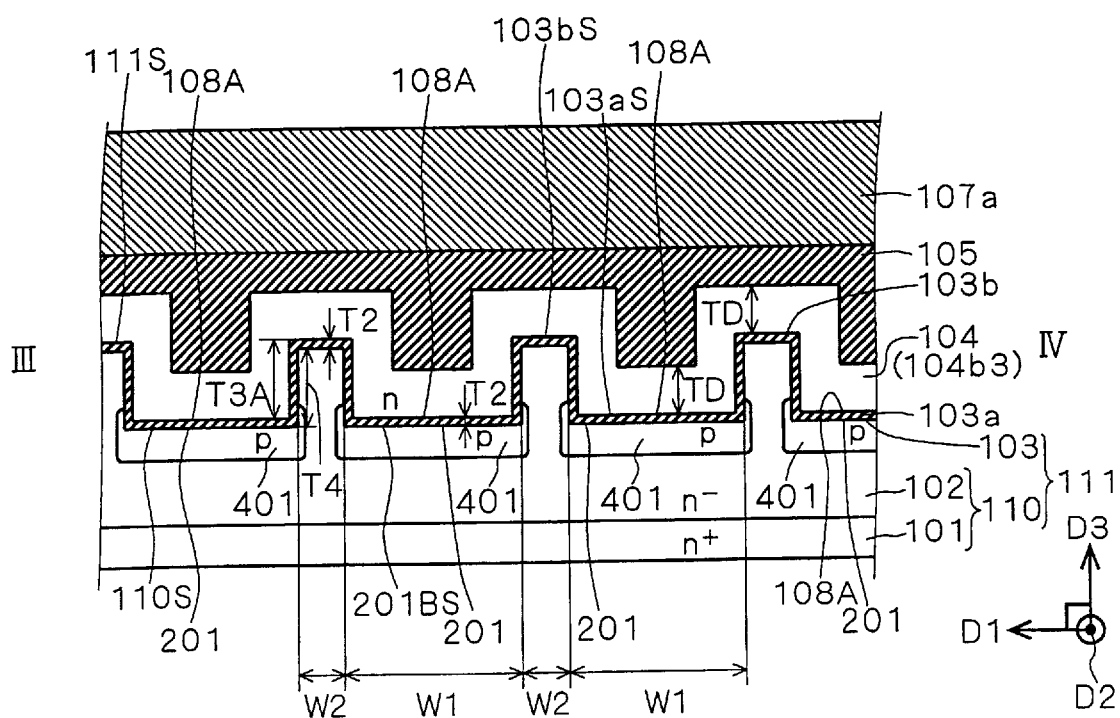

The idea of this modification is applicable to both of the modifications 1 and 2 of the embodiment 1. FIGS. 12 and 13 show such exemplary applications to the modifications 1 and 2 respectively.

<Modification 4 of Embodiment 1>

Figure 14:
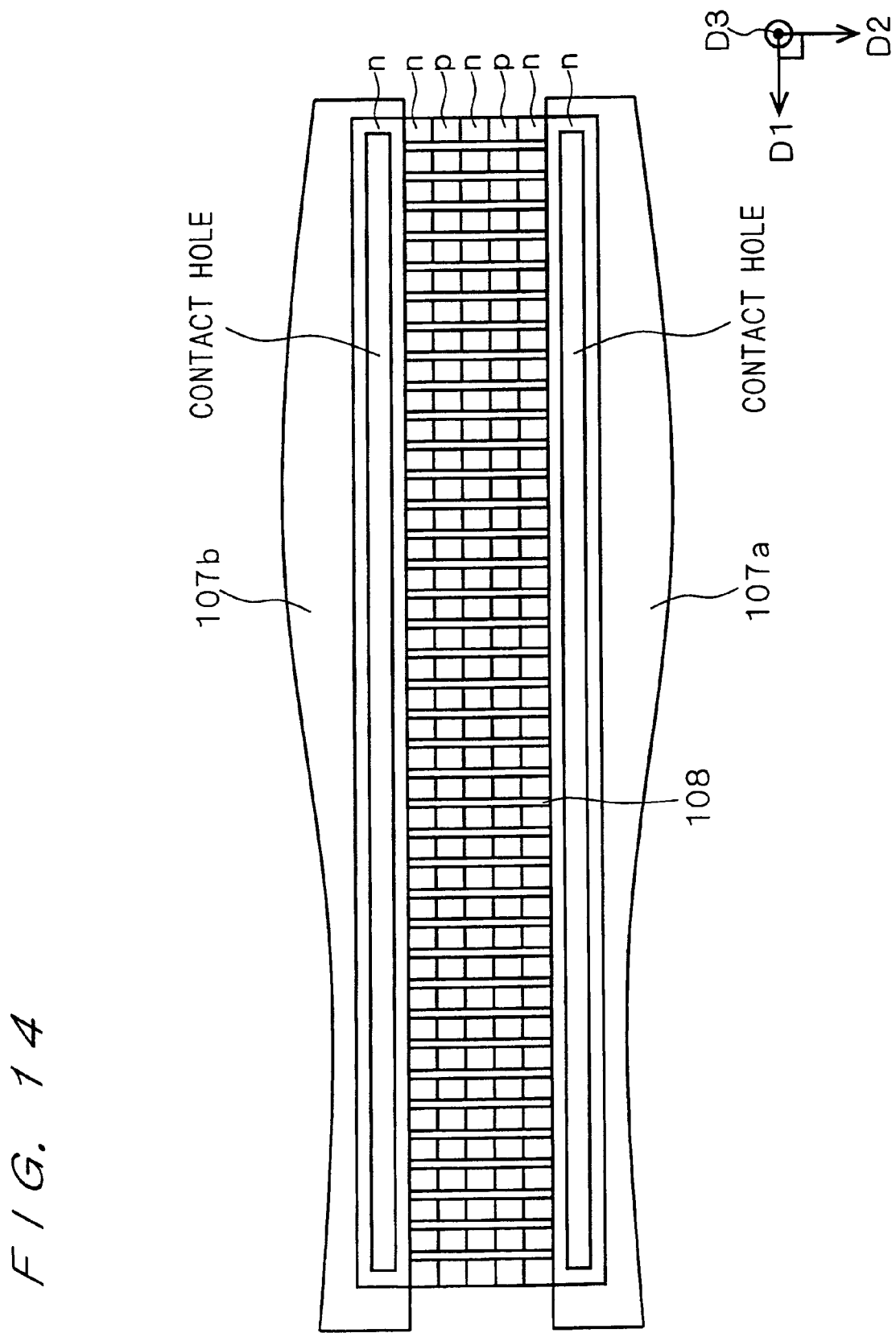
FIG. 14 is a top plan view showing the structure of a first region of a semiconductor device according to a modification 4 of the embodiment 1 of the present invention.
Figure 15:
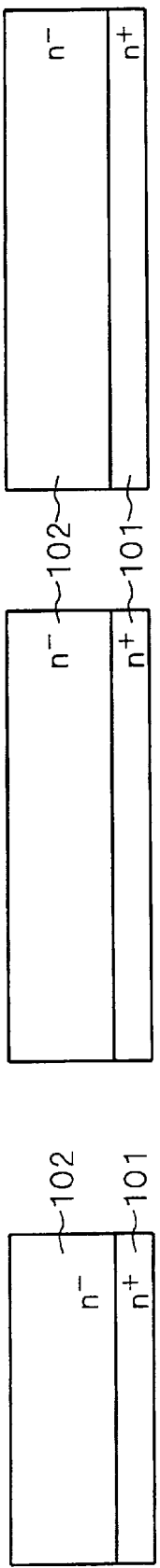
Figure 16:
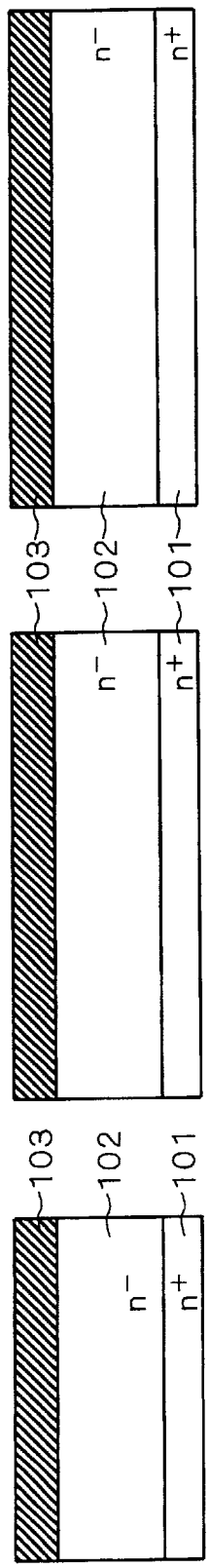
Figure 17:
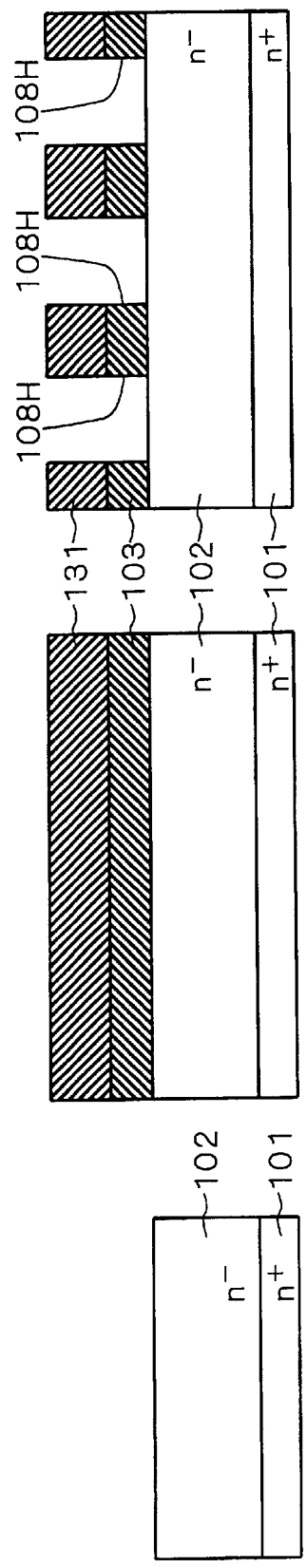
Figure 18:
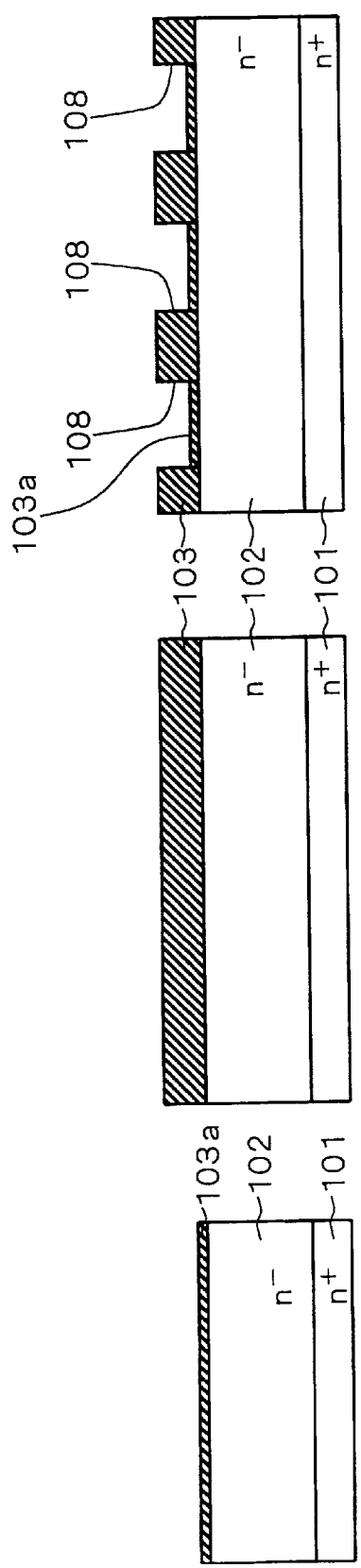
Figure 19:
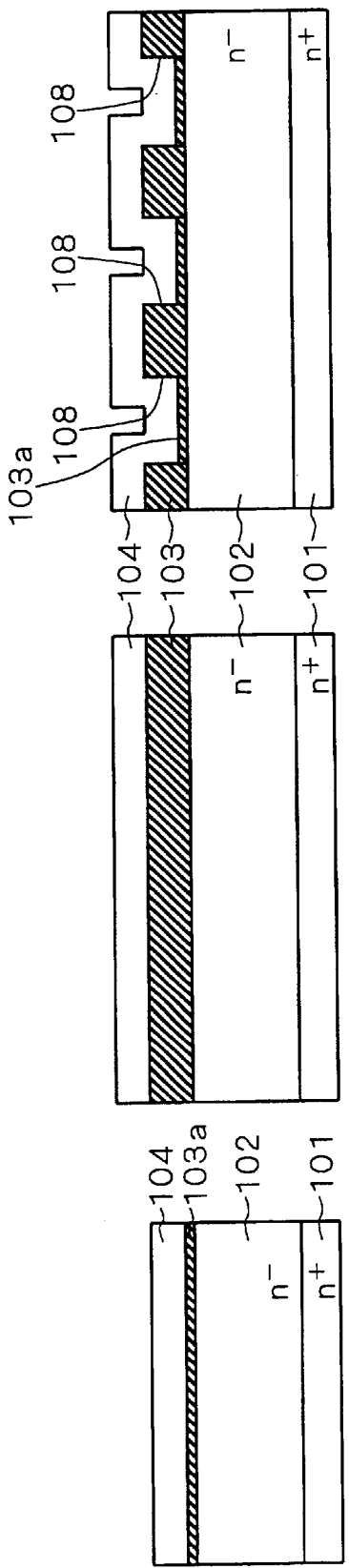
Figure 20:
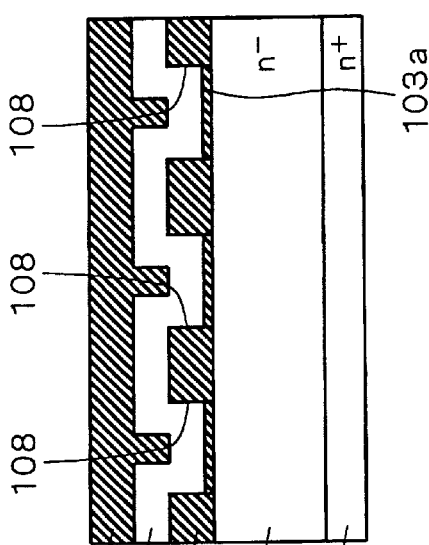
Figure 20:
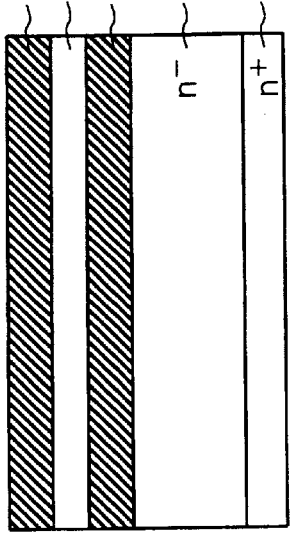
Figure 20:
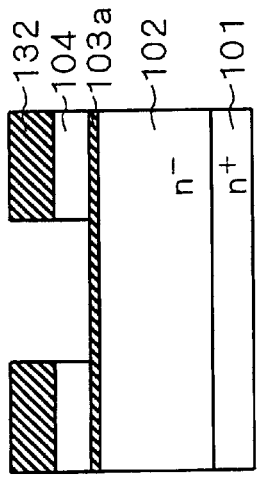
Figure 22:
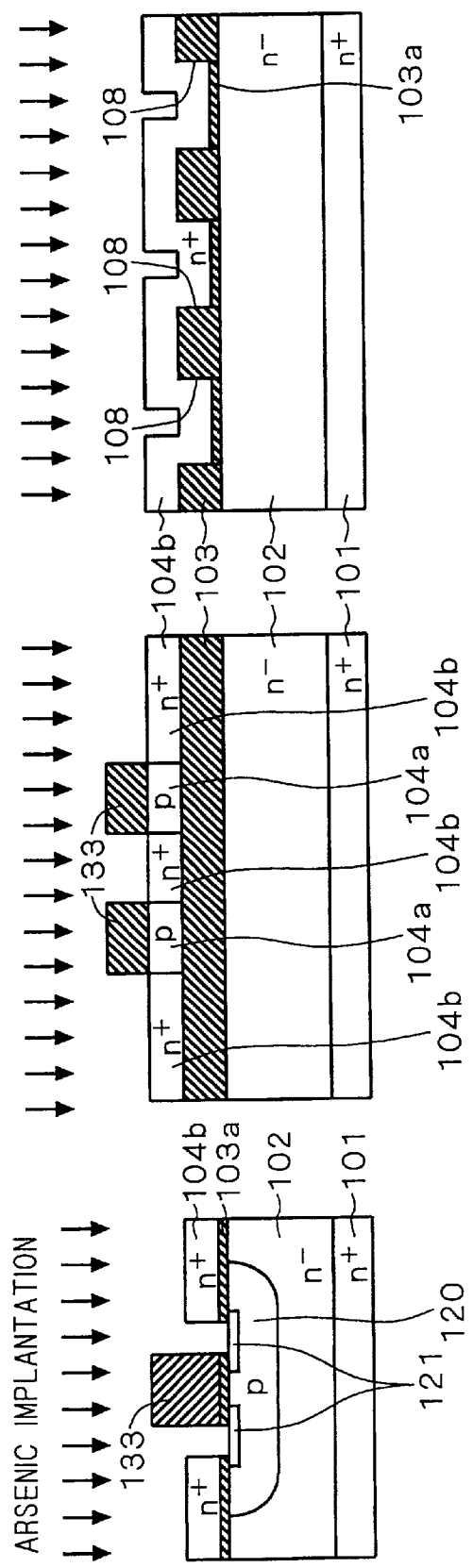
Figure 23:
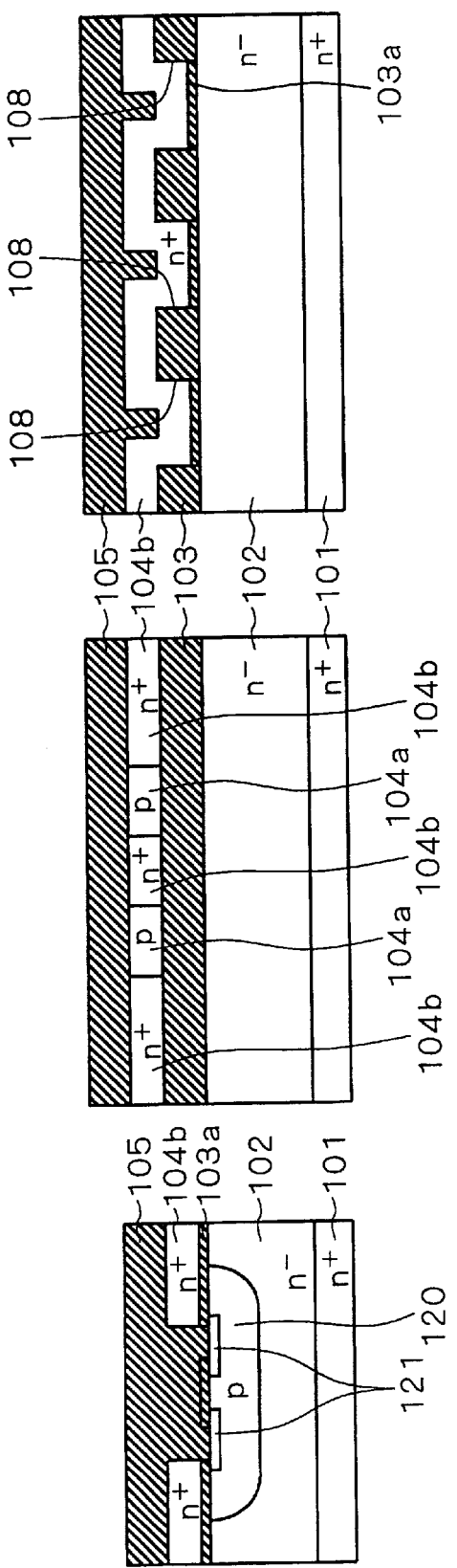
Figure 24:
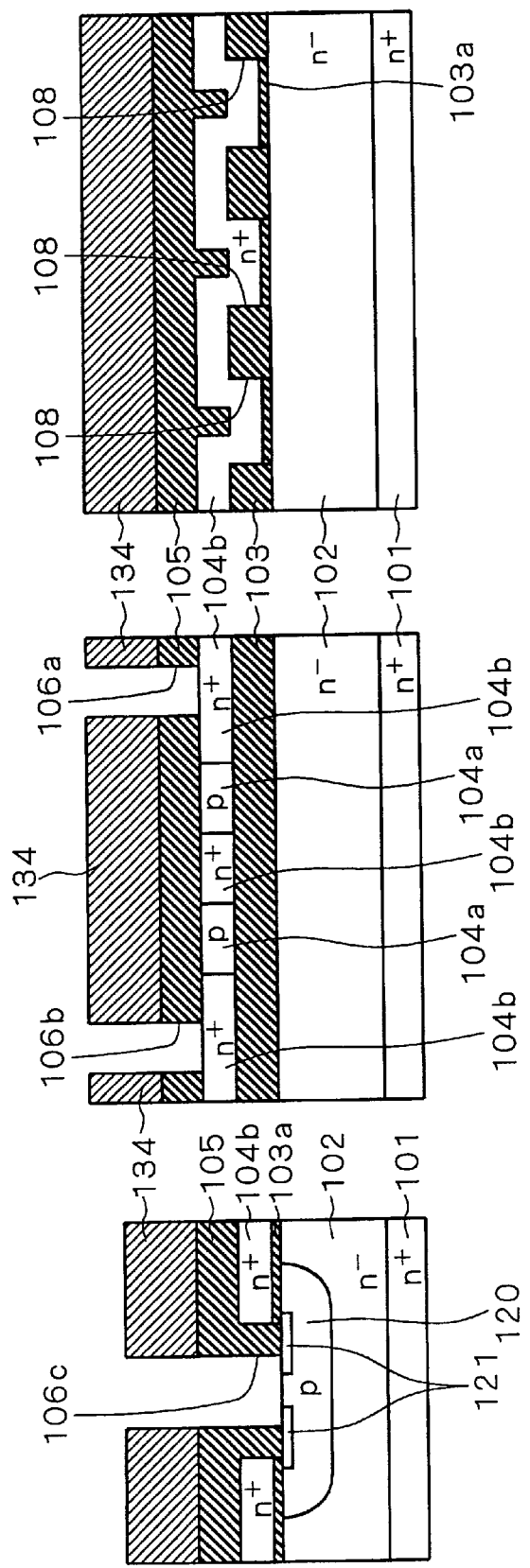
Figure 25:
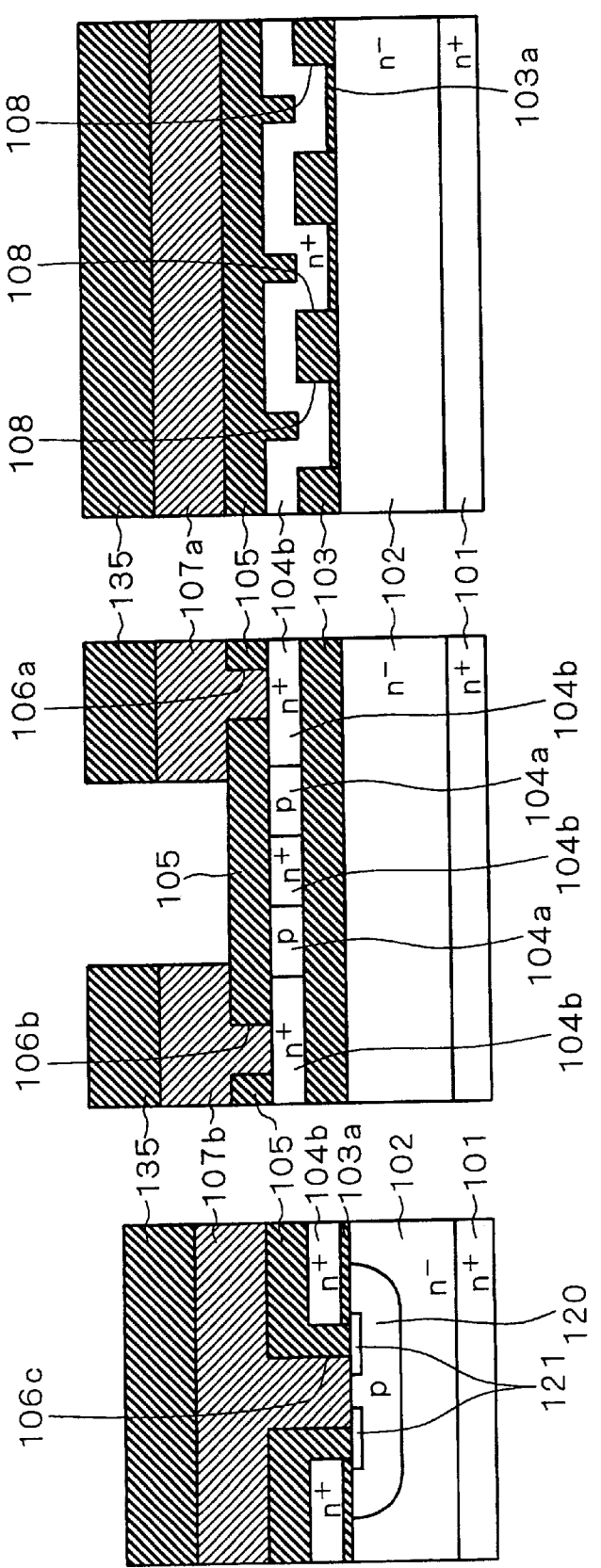

While the Zener diode is provided in the form of a ring enclosing the gate pad in each of the aforementioned examples, the structure of the base layer proposed in the embodiment 1 or any of the modifications 1, 2 and 3 thereof may be substitutionally applied to a Zener diode linearly formed as shown in FIG. 14. Also in such a modification 4, an effect similar to that described above with reference to the embodiment 1 or any of the modifications 1, 2 and 3 thereof.

Embodiment 2

An embodiment 2 of the present invention relates to a method of manufacturing the semiconductor device according to the embodiment 1 having the first region structure illustrated in FIGS. 1 to 3. The manufacturing method according to this embodiment is now described with reference to longitudinal sectional views showing manufacturing steps.

FIGS. 15(A) to 26(A), 15(B) to 26(B) and 15(C) to 26(C) are step diagrams showing the method of manufacturing the semiconductor device according to the embodiment 1. Among these figures, FIGS. 15(A) to 26(A) are longitudinal sectional views showing a manufacturing process for a DMOS transistor in a second region, FIGS. 15(B) to 26(B) are longitudinal sectional views taken along the line I–II in FIG. 1 showing a manufacturing process for the structure of a first region, an FIGS. 15(C) to 26(C) are longitudinal sectional views taken along the line III–IV in FIG. 1 showing a manufacturing process for the structure of the first region respectively.

In order to manufacture a gate protection Zener diode 100 according to the embodiment 1, a silicon substrate containing an $n^+$-type impurity in a high concentration is first prepared. This silicon substrate corresponds to the $n^+$-type semiconductor layer 101 illustrated in FIGS. 2 and 3.

Then, an n-type semiconductor layer 102 of a low concentration is formed on an upper main surface of the $n^+$-type semiconductor layer 101 by epitaxy, as shown in FIGS. 15(A), 15(B) and 15(C). Consequently, a flat semiconductor substrate prepared from a base material of silicon is completed.

Then, an oxide film 103, which is an insulator film, is formed on the overall surface of the n-type semiconductor layer 102, as shown in FIGS. 16(A), 16(B) and 16(C).

Then, in order to form steps or openings 108H in the oxide film 103, a photoresist pattern 131 is selectively formed on the upper surface of the oxide film 103 by photolithography, and the oxide film 103 is etched through the photoresist pattern 131 serving as a mask, as shown in FIGS. 17(B) and 17(C). Thus, a plurality of openings 108H arranged in the first direction D1 are formed in the oxide film 103. At that time, the oxide film 103, unnecessary in a DMOS transistor part, is fully etched as shown in FIG. 17(A).

Then, the photoresist pattern 131 is removed, and thereafter an oxide film 103a having a smaller thickness than the existing oxide film 103 is formed on an exposed surface of the n-type semiconductor layer 102 or the bottom surfaces of the openings 108H for the purpose of insulation, as shown in FIGS. 18(B) and 18(C). Thus, a plurality of grooves 108 forming irregular portions arranged in the first direction D1 are formed on the upper surface of the oxide film 103 (including the oxide film 103a). In the DMOS transistor part, another thin oxide film 103a is formed on the overall exposed surface of the n-type semiconductor layer 102 as a mask oxide film for a later step of ion-implanting impurities, as shown in FIG. 18(A).

Then, a polysilicon layer 104 serving as the base material for the Zener diode 100 is deposited on the overall exposed surface by CVD, as shown in FIGS. 19(A), 19(B) and 19(C). This polysilicon layer or semiconductor film 104, which is non-doped, cannot serve as a diode in this state.

Then, a photoresist film is formed on the overall upper surface of the polysilicon layer 104, and a part of the photoresist film corresponding to an active region of the DMOS transistor part and excluding a Zener diode region located around a gate pad are removed by photolithography for forming a photoresist pattern 132 on the upper surface of the polysilicon layer 104, as shown in FIGS. 20(A), 20(B) and 20(C). Thereafter the polysilicon layer 104 is dry-etched through the photoresist pattern 132 serving as a mask.

Then, the aforementioned photoresist pattern 132 is removed, a p-type impurity (e.g., boron) is ion-implanted and thereafter heat treatment is performed for forming a p region of the Zener diode 100 in the polysilicon layer 104 selectively left through the aforementioned dry etching and forming a p base layer 120 serving as a channel in the active region of the DMOS transistor, as shown in FIGS. 21(A), 21(B) and 21(C). The polysilicon layer 104 containing the p-type impurities is hereinafter referred to as a p-type polysilicon layer 104a, to be distinguished from a non-doped layer.

Then, in order to form $n^+$ regions of the diode 100 and to form $n^+$ source regions 121 of the DMOS transistor region, photoresist patters 133 are selectively formed on an upper main surface of the p-type polysilicon layer 104a by photolithography. Thereafter, n-type impurities of high concentration (e.g., arsenic) are ion-implanted. Then, the photoresist patterns 133 are removed, and thereafter heat treatment is performed as shown in FIGS. 22(A), 22(B) and 22(C). The regions of the polysilicon layer 104 containing the n-type impurity are hereinafter referred to as $n^+$-type polysilicon layers 104b, to be distinguished from the p-type polysilicon layers 104a.

After removing the photoresist patterns 133, an interlayer isolation film (PSG or BPSG) 105 is formed on the overall exposed surface by CVD for the purpose of insulation, as shown in FIGS. 23(A), 23(B) and 23(C).

Then, a photoresist pattern 134 is selectively formed on an upper surface of the oxide film 105 by photolithography for executing etching through this photoresist pattern 134 serving as a mask, in order to obtain a contact hole 106a for connecting the n+-type polysilicon layer 104b forming an end of the Zener diode 100 with a gate electrode and a contact hole 106b for connecting the n+-type polysilicon layer 104b forming another end of the Zener diode with a source electrode, as shown in FIGS. 24(A), 24(B) and 24(C). In the DMOS transistor region shown in FIG. 24(A), a photoresist pattern 134 having an opening on such a region that a source electrode layer described later can bring the p base region 120 and the n+ source region 121 into ohmic contact in common in the oxide film 105 is formed on the oxide film 105 and a portion of the oxide film 105 located immediately under the opening is etched through the photoresist pattern 134 having this opening serving as a mask thereby forming a contact hole 106c enabling electrical connection between the source region 121 and the aforementioned source electrode layer. Thereafter the photoresist pattern 134 is removed.

Then, a conductive Al-Si layer is deposited on the overall exposed surface by sputtering and a photoresist pattern 135 is formed on the surface of the Al-Si layer by photolithography for performing etching, thereby forming a gate electrode layer 107a and a source electrode layer 107b, as shown in FIGS. 25(A), 25(B) and 25(C). Thereafter the photoresist pattern 135 is removed.

Then, a conductive Ti/Ni/Au alloy film is deposited on the overall lower main surface of the n+-type semiconductor layer 101 thereby forming a drain electrode 109, as shown in FIGS. 26(A), 26(B) and 26(C).

The gate protection Zener diode 100 is completed through the aforementioned steps.

In the manufacturing method according to this embodiment, the Zener diode 100 of polysilicon is formed on the plurality of irregular portions or the plurality of grooves 108 arranged in its peripheral direction, whereby it follows that the Zener diode 100 has a peripheral length not only in the transverse direction but also in the vertical direction. Therefore, the area of p-n junction surfaces in the Zener diode 100 is increased to increase the sectional area of a path for a surge current, whereby parasitic resistance is sufficiently reduced. Therefore, a clamping effect of the Zener diode 100 in the input protection circuit as well as a function of protecting a gate insulator film of the DMOS transistor are improved, as shown in FIG. 4.

<Modification 1 of Embodiment 2>

A modification 1 of the embodiment 2 relates to a method of manufacturing the semiconductor device according to the modification 1 of the embodiment 1. For convenience of illustration, only longitudinal sectional views of the gate protection Zener diode according to the modification 1 of the embodiment 1 taken along the line III–IV are shown in relation to the following description of manufacturing steps. The step diagrams of FIGS. 19(C) to 26(C) disclose contents common to those of the manufacturing steps for the gate protection Zener diode according to this modification, and hence FIGS. 19(C) to 26(C) and the description of these drawings are also applied to this modification.

Figure 27:
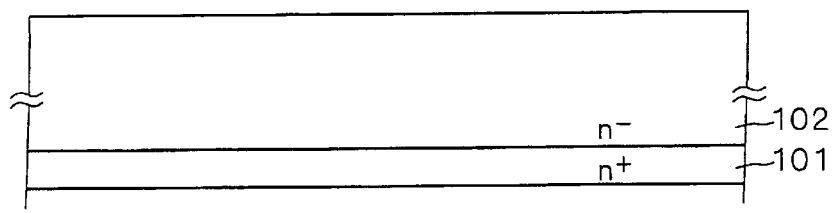
FIGS. 27 to 32 are longitudinal sectional views showing steps of manufacturing a semiconductor device according to a modification 1 of the embodiment 2 of the present invention.
Figure 28:
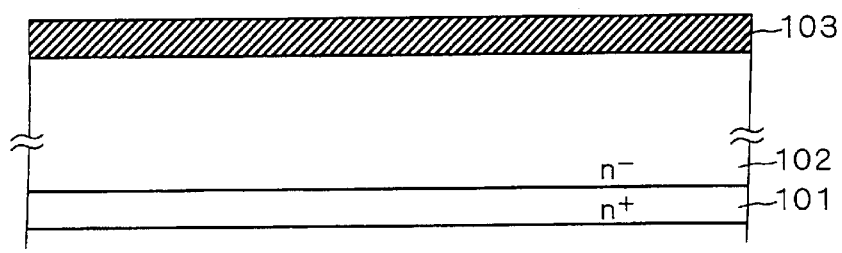

In order to manufacture a gate protection Zener diode 200 according to this modification, an oxide film 103 which is an insulator film is first formed on the upper surface of an n-type semiconductor layer 102 through a procedure similar to that of the embodiment 2, as shown in FIGS. 27 and 28.

Figure 29:
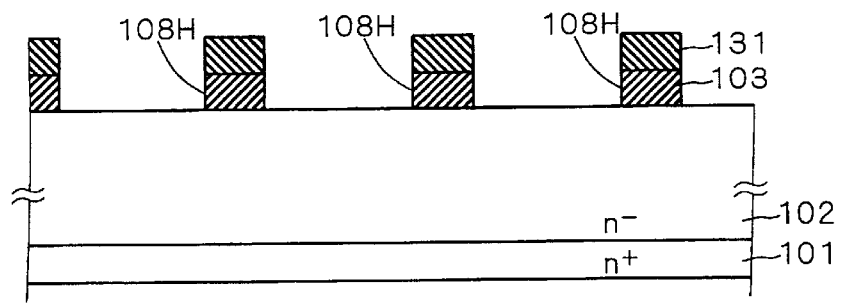

Then, a photoresist pattern 131 having a pattern for forming step portions or openings 108H in the oxide film 103 is selectively formed on the upper surface of the oxide film 103 by photolithography for etching the oxide film 103 through the photoresist pattern 131 serving as a mask, as shown in FIG. 29. On the side of a DMOS transistor, however, the oxide film 103 is not etched but the structure shown in FIG. 16(A) is maintained.

Figure 30:
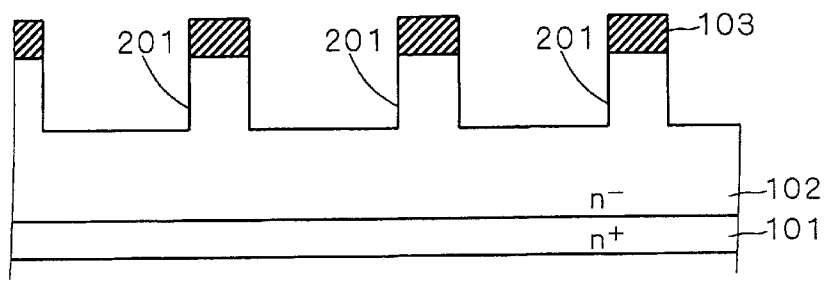

Thereafter the photoresist pattern 131 is removed and the exposed surface of the n-type semiconductor layer 102 is etched with an RIE (reactive ion etcher), as shown in FIG. 30. Thus, a plurality of grooves 201 forming irregular portions are formed in the upper surface of the epitaxial layer 102.

Figure 31:
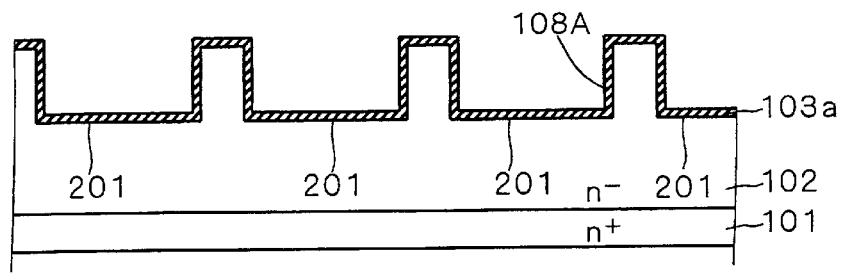

Then, the oxide film 103 is temporarily entirely removed, and an oxide film 103a is formed on the upper surface of the n-type semiconductor layer 102 again for the purpose of insulation, as shown in FIG. 31.

Figure 32:
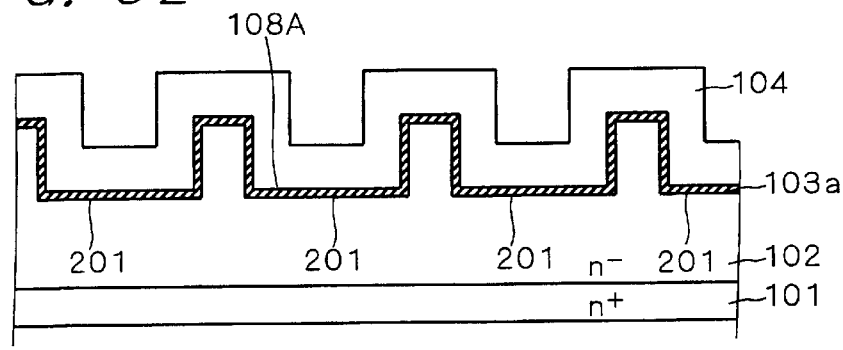

Then, a non-doped polysilicon layer or semiconductor film 104 serving as the base material for the Zener diode 200 is deposited on the overall upper surface of the oxide film 103a by CVD, as shown in FIG. 32.

Subsequent manufacturing steps are similar to those subsequent to that shown in FIG. 20(C) described with reference to the embodiment 2, and hence description thereof is omitted.

According to the manufacturing method of this modification, the depths of the plurality of grooves 201 and a plurality of grooves 108A can be readily increased beyond that of the plurality of grooves 108 in the embodiment 2, whereby the peripheral length of the Zener diode 200 can be further increased for further reducing parasitic resistance.

<Modification 2 of Embodiment 2>

A modification 2 of the embodiment 2 relates to a method of manufacturing the semiconductor device according to the modification 2 of the embodiment 1.

Manufacturing steps according to this modification can be implemented by partially changing the manufacturing steps according to the modification 1 of the embodiment 2, and hence only the changed points are now described.

The manufacturing steps shown in FIGS. 27 to 30 are common to those for the gate protection Zener diode according to the modification 2 of the embodiment 1, and hence FIGS. 27 to 30 and description thereof are applied to this modification.

Figure 33:
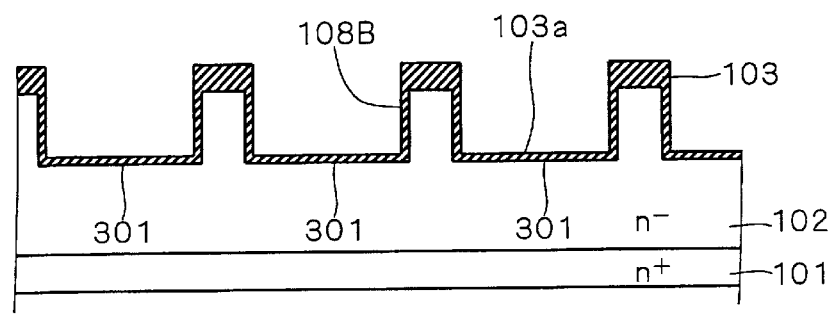
FIGS. 33 and 34 are longitudinal sectional views showing steps of manufacturing a semiconductor device according to a modification 2 of the embodiment 2 of the present invention.

An n-type semiconductor layer 102 is etched with an RIE as shown in FIG. 30, and thereafter an oxide film 103a having a smaller thickness than an oxide film 103 is formed on an exposed upper surface of the n-type semiconductor layer 102 for the purpose of insulation while leaving the oxide film 103 on convex portions of the n-type semiconductor layer 102, as shown in FIG. 33. Thus, grooves 301 provided on the upper surface of the epitaxial layer 102 and grooves 108B provided on the upper surface of the oxide film 103 formed on the grooves 301 are formed.

Figure 34:
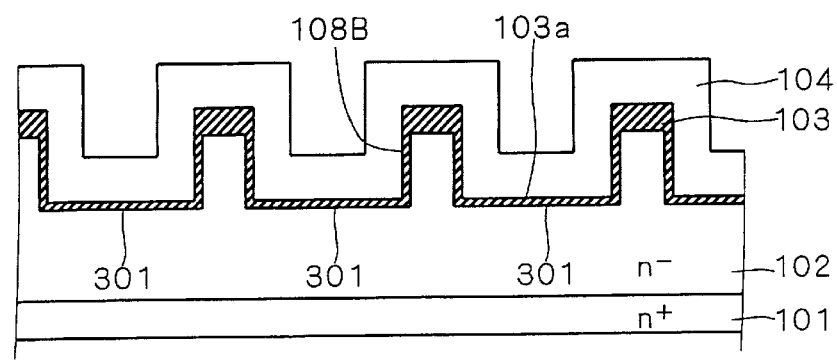

Then, a non-doped polysilicon layer (semiconductor film) 104 serving as the base material for the Zener diode is deposited on the overall upper surface of the oxide film 103 by CVD, as shown in FIG. 34.

Subsequent manufacturing steps are similar to those subsequent to that shown in FIG. 20(C) described with reference to the embodiment 2, and hence description thereof is omitted.

According to the manufacturing method of this modification, the depth of the plurality of grooves 108B can be readily increased beyond those of the plurality of grooves 108 in the embodiment 2 and the plurality of grooves 108A in the modification 1of the embodiment 2, whereby the peripheral length of the Zener diode can be further increased for further reducing parasitic resistance.

<Modification 3 of Embodiment 2>

A modification 3 of the embodiment 2 relates to a method of manufacturing the semiconductor device according to the modification 3 of the embodiment 1. Manufacturing steps according to this modification can be implemented by partially changing the manufacturing steps according to the embodiment 2, and hence only the changed points are now described.

The manufacturing steps shown in FIGS. 15(C) to 18(C) are common to those for the gate protection Zener diode according to the embodiment 1, and hence FIGS. 15(C) to 18(C) and description thereof are applied to this modification.

Figure 35:
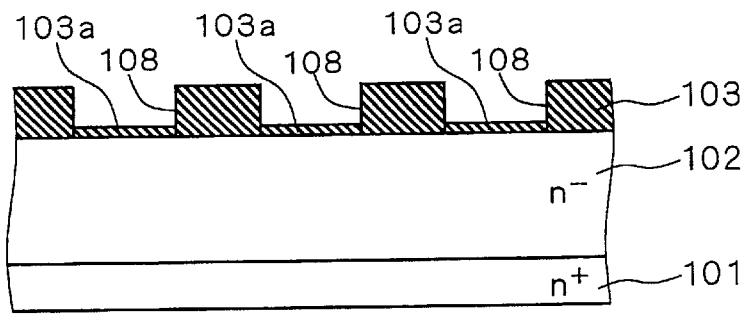
FIGS. 35 to 37 are longitudinal sectional views showing steps of manufacturing a semiconductor device according to a modification 3 of the embodiment 2 of the present invention.

An oxide film 103a is formed on a bottom surface of each of openings 108H formed in an oxide film 103 for the purpose of insulation. Thus, a plurality of grooves 108 are formed in the oxide film 103, as shown in FIG. 35. In this modification, the oxide film 103a also has a function serving as a masking oxide film before ion implantation.

Figure 36:
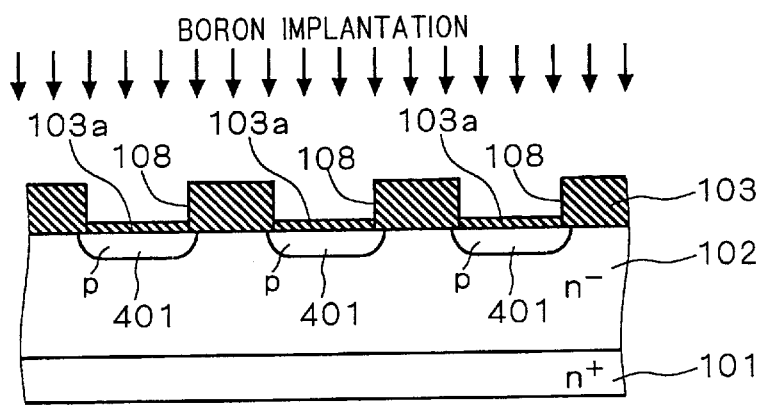

Then, p-type impurities (e.g., boron) are ion-implanted and heat treatment is thereafter performed thereby forming a plurality of p base regions 401 immediately under the corresponding grooves 108 respectively, as shown in FIG. 36. While the p base regions 401 are separated from each other in FIGS. 10, 11 and 36 for the purpose of convenience, an effect similar to that of the plurality of p base regions 401 is attained also when the p base regions 401 are connected with each other due to transverse diffusion of a p region.

Figure 37:
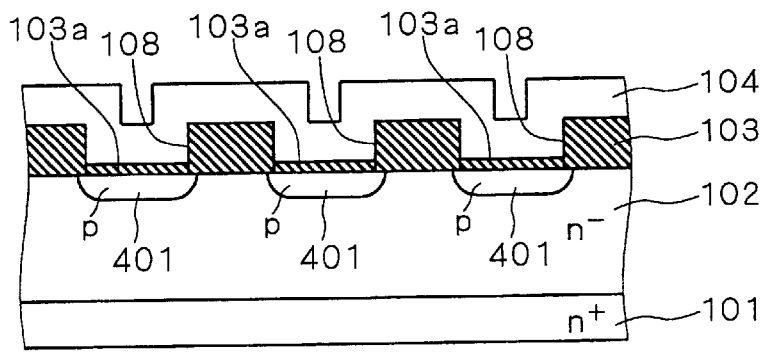

Then, a non-doped polysilicon layer 104 serving as the base material for the Zener diode is deposited on the overall upper surface of the oxide film 103 by CVD, as shown in FIG. 37.

Subsequent steps of manufacturing a first region are similar to those shown in FIGS. 20(C) to 26(C), and hence description of these steps is omitted.

According to the manufacturing method of this modification, an effect of reducing parasitic resistance of the Zener diode is attained similarly to the embodiment 1, while the p base regions 401 are formed in the upper surface of the n-type semiconductor layer 102 under the grooves 108 and hence the p base regions 401 are connected with each other through depletion layers when a withstand voltage is applied across a source and a drain, for attaining an effect capable of improving the withstand voltage of a DMOSFET.

When forming a plurality of p base regions 401 in the upper surface of the n-type semiconductor layer 102 in the first region of the semiconductor device according to the modification 1 or 2 of the embodiment 1, p-type impurities (e.g., boron) may be ionu-implanted as described with reference to FIG. 36 after the step shown in FIG. 30 or 33.

<Modification 4 of Embodiment 2>

While the n-type semiconductor layer 102 is etched with an RIE for forming the irregular portions or the grooves 201 in the modification 1 of the embodiment 2, a modification 4 of the embodiment 2 modifies this point.

Figure 38:
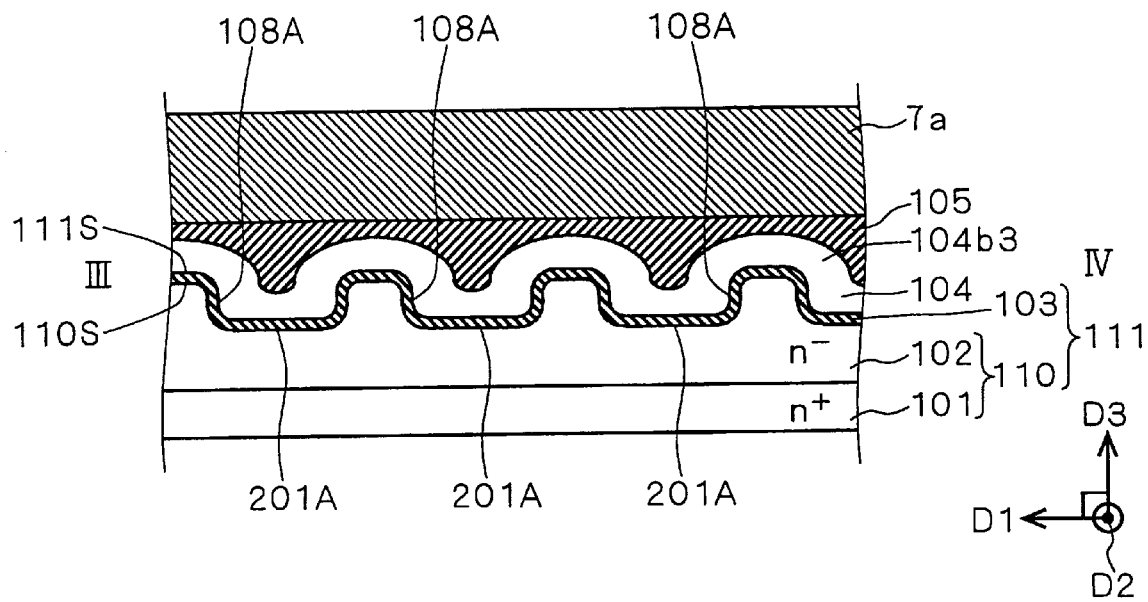
FIG. 38 is a longitudinal sectional view showing the structure of a first region of a semiconductor device according to a modification 4 of the embodiment 2 of the present invention.
Figure 39:
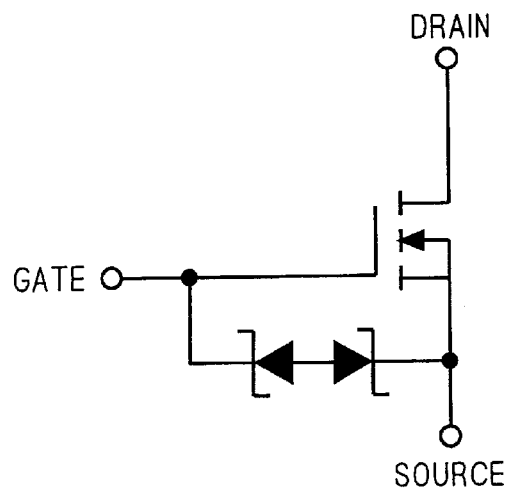
FIG. 39 is a circuit diagram showing a power MOS transistor having an input protection Zener diode connected between a gate electrode and a source electrode.

As illustrated in FIG. 38 showing a longitudinal sectional view taken along the line III–IV in FIG. 1, grooves (first grooves) 108A may be formed in the upper surface of an insulator film 103 by forming grooves (second grooves) 201A in the upper surface of an n-type semiconductor layer 102 by LOCOS oxidation and forming the insulator film 103 on the upper surface of the n-type semiconductor layer 102 including the grooves 201A. In this case, corners of the grooves 201A and those of grooves 108A are rounded.

<Modification Common to Embodiments 1 and 2>

(1) In relation to the Zener diode, the first semiconductor region connected with the gate and the second semiconductor region connected with the source may be n-type or p-type diffusion regions.

While the number of the p-n junctions in the Zener diode is not particularly restricted, the Zener diode must be bidirectional and hence must have at least an npn structure or a pnp structure, and the conductivity types of diffusion regions (the first and second semiconductor regions) on both ends are preferably identical to each other.

(2) While the above description has been made with reference to an n-channel power MOSFET, the present invention is also executable on a p-channel power MOSFET. Similar effects can be attained also in this case.

(3) While the above description has been made with reference to a planar power MOSFET, the present invention is also applicable to a UMOSFET or a VMOSFET having a gate trench structure. Further, the present invention is also applicable to a general insulated gate semiconductor device such as an IGBT.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:

a base layer; and a diode arranged on an upper surface of said base layer, wherein said diode comprises:

a plurality of semiconductor regions extending in a first direction respectively and successively forming p-n junctions in a second direction perpendicular to said first direction, the conductivity type of a first semiconductor region located on the side of a first end in said second direction among said plurality of semiconductor regions of said diode is equal to the conductivity type of a second semiconductor region located on the side of a second end opposed to said first end, and the interface between said base layer and said diode in said upper surface of said base layer comprises:

a plurality of groove portions having a depth in a third direction perpendicular to said first direction and said second direction, extending in said second direction and successively arranged in said first direction.

2. The semiconductor device according to claim 1, wherein at least one of said plurality of semiconductor regions of said diode comprises:

an irregular portion having an irregular shape defined by said plurality of groove portions of said interface.

3. The semiconductor device according to claim 1, wherein at least one of said plurality of semiconductor regions of said diode comprises:

an upper surface having a flat portion opposed to a bottom surface of each of said plurality of groove portions of said interface in said third direction.

4. The semiconductor device according to claim 1, wherein said base layer comprises:

a base semiconductor layer of a prescribed conductivity type, and an insulator film arranged on an upper surface of said base semiconductor layer, and said insulator film comprises:

an upper surface opposed to an interface between said base semiconductor layer and said insulator film in said third direction and corresponding to said interface between said base layer and said diode.

5. The semiconductor device according to claim 4, wherein each of said plurality of groove portions is defined as a first groove portion, and said interface between said base semiconductor layer and said insulator film comprises a plurality of second groove portions each opposed to said first groove portion.

6. The semiconductor device according to claim 5, wherein a first thickness of said insulator film arranged on a portion of said interface between said base semiconductor layer and said insulator film held between two adjacent second groove portions among said plurality of second groove portions in said third direction is larger than a second thickness of said insulator film arranged on a bottom surface of each of said plurality of second groove portions in said third direction.

7. The semiconductor device according to claim 4, wherein said prescribed conductivity type of said base semiconductor layer is a first conductivity type, and said base layer further comprises:

a plurality of semiconductor well regions of a second conductivity type extending from a portion located under a bottom surface of each of said plurality of groove portions in said interface between said base semiconductor layer and said insulator film into said base semiconductor layer.

8. The semiconductor device according to claim 1, further comprising:

a MOS transistor structure, comprising a gate electrode and a main electrode, arranged on a second region in said upper surface of said base layer when defining a portion of said upper surface of said base layer provided with said diode as a first region, wherein said first semiconductor region is electrically connected with said gate electrode, and said second semiconductor region is electrically connected with said main electrode.

* * * * *